United States Patent
Okushima

(10) Patent No.: US 7,294,542 B2
(45) Date of Patent: Nov. 13, 2007

(54) METHOD OF FABRICATING A SEMICONDUCTOR DEVICE HAVING CMOS TRANSISTORS AND A BIPOLAR TRANSISTOR

(75) Inventor: Mototsugu Okushima, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/442,288

(22) Filed: May 30, 2006

(65) Prior Publication Data

US 2006/0223258 A1    Oct. 5, 2006

Related U.S. Application Data

(62) Division of application No. 09/852,735, filed on May 11, 2001, now abandoned.

(30) Foreign Application Priority Data

May 15, 2000 (JP) ............................. 2000-141304

(51) Int. Cl.
  *H01L 21/8238* (2006.01)
(52) U.S. Cl. ...................... 438/199; 438/200
(58) Field of Classification Search ........ 438/199–200, 438/202–203, 309, 322, 328; 257/355, 369
  See application file for complete search history.

(56) References Cited

U.S. PATENT DOCUMENTS

| | | | |
|---|---|---|---|
| 5,043,782 A | 8/1991 | Avery | |
| 5,272,371 A | 12/1993 | Bishop et al. | |
| 5,276,582 A | 1/1994 | Merrill et al. | |
| 5,326,994 A * | 7/1994 | Giebel et al. ............... | 257/174 |
| 5,471,082 A | 11/1995 | Maeda | |
| 5,539,327 A | 7/1996 | Shigehara et al. | |
| 5,623,387 A | 4/1997 | Li et al. | |
| 5,648,676 A | 7/1997 | Iwai et al. | |
| 5,731,614 A * | 3/1998 | Ham ........................... | 257/355 |
| 5,774,318 A | 6/1998 | McClure et al. | |
| 5,821,797 A | 10/1998 | Kinugasa et al. | |

FOREIGN PATENT DOCUMENTS

| | | |
|---|---|---|
| JP | 61-232657 | 10/1986 |
| JP | 61-251165 | 11/1986 |
| JP | 62-242354 | 10/1987 |
| JP | 02-199868 | 8/1990 |
| JP | 02-244752 | 9/1990 |

(Continued)

OTHER PUBLICATIONS

Adel S/ Sedra, Kenneth C. Smith, Microelectronic Circuits, Holt, Rinehart and Winston, 1987, pp. 408-410.

*Primary Examiner*—Theresa Doan
(74) *Attorney, Agent, or Firm*—Young & Thompson

(57) ABSTRACT

To reduce electric current concentration and electric field concentration in junction parts even in the case of miniaturization, and to achieve triggering at low voltage, an ESD protection apparatus is installed between an input terminal of a semiconductor integrated circuit chip and a CMOS transistor. The ESD protection apparatus includes a trigger element having diodes which are broken down by overvoltage applied to the input terminal and an ESD protection element including vertical bipolar transistors for discharging the accumulated electric charge of the input terminal by being electrically discharged owing to the breakdown of the diodes.

6 Claims, 33 Drawing Sheets

FOREIGN PATENT DOCUMENTS

| | | |
|---|---|---|
| JP | 05-259394 | 10/1993 |
| JP | 09-213891 | 10/1993 |
| JP | 06-163841 | 6/1994 |
| JP | 06-335162 | 12/1994 |
| JP | 10-242400 | 9/1998 |
| JP | 11-168183 | 6/1999 |
| JP | 11-251533 | 9/1999 |
| KR | 1996-0014444 | 10/1996 |
| KR | 1999-30302 | 4/1999 |

* cited by examiner

DIODE UTILIZING ONE PORTION OF LONGITUDINAL BIPOLAR TRANSISTOR

DIODE COMPRISING p+LAYER/n well FABRICATED BY EXISTING CMOS PROCESS

METHOD OF FABRICATING A SEMICONDUCTOR DEVICE HAVING CMOS TRANSISTORS AND A BIPOLAR TRANSISTOR

BACKGROUND OF THE INVENTION

1. Field of the Invention

The present invention relates to an ESD protection apparatus to be installed in a semiconductor integrated circuit chip in order to protect a semiconductor integrated circuit from electrostatic discharge (ESD) and to a method for fabricating the protection apparatus.

2. Description of the Prior Art

A conventional ESD protection apparatus in the CMOS process generally protects a semiconductor integrated circuit using a MOSFET transverse parasitic bipolar transistor by releasing the electric current in the transverse direction lateral direction in a silicon substrate. On the other hand, the ESD protection apparatus has been required to be further miniaturized since the number of pins to be mounted on one chip has been increased sharply following the recent acute requirement of development of semiconductor integrated circuits made finer.

BRIEF SUMMARY OF THE INVENTION

Object of the Invention

However, as the miniaturization has been proceeding further, the electric current concentration and electric field concentration upon the junction parts has been increased more, so that the ESD protection apparatus has sometimes been broken owing to the heat generation. Therefore, there has been a limit to further improve the capability of the ESD protection apparatus. Further, the gate insulation film of a CMOS transistor has recently been made thinner, so that the gate insulation film sometimes has been broken before the ESD protection apparatus starts operating (reference to FIG. 33). Consequently, it has highly been expected to develop the ESD protection apparatus capable of triggering at a lower voltage.

Hence, the present invention aims to provide an ESD protection apparatus in which electric current concentration and electric field concentration upon the junction parts hardly take place even if miniaturization is advanced and which is capable of triggering at a lower voltage and to provide a method for fabricating such an ESD protection apparatus.

SUMMARY OF THE INVENTION

The ESD protection apparatus of the present invention is to be installed between a pad of a semiconductor integrated circuit chip and an inner circuit of the semiconductor integrated circuit chip. The ESD protection apparatus is provided with a trigger element comprising a diode to be broken down by overvoltage applied to the pad and an ESD protection element comprising a longitudinal bipolar transistor also known in the art as a vertical bipolar transistor for discharging the accumulated electric charge of the pad by being electrically discharged attributed to the breakdown of the diode.

As compared with a transverse bipolar transistor, a longitudinal bipolar transistor has a wide junction surface area for the same occupancy surface area, so that even if miniaturization is promoted, the electric current concentration and the electric field concentration hardly take place. On the other hand, a diode is easy to set a desired breakdown voltage by changing the impurity concentration. Consequently, an ESD protection apparatus in which electric current concentration and electric field concentration upon the junction parts hardly take place even if miniaturization is advanced and which is capable of triggering at a lower voltage can be obtained by utilizing the breakdown voltage of a diode for the trigger of a longitudinal bipolar transistor.

A first practical example of an ESD protection apparatus of the present invention is as follows. The pad is an input terminal or an output terminal. The trigger element comprises a first and a second diodes and a first and a second resistors. The ESD protection element comprises NPN type first and second longitudinal bipolar transistors. Regarding the first diode, the cathode is connected with the pad and the anode is connected with the base of the first longitudinal bipolar transistor. Regarding the second diode, the cathode is connected with an electric power source terminal and the anode is connected with the base of the second longitudinal bipolar transistor. The first resistor is connected between the anode of the first diode and the ground terminal. The second resistor is connected between the anode of the second diode and the pad. Regarding the first longitudinal bipolar transistor, the collector is connected with the pad and the emitter is connected with the ground terminal. Regarding the second longitudinal bipolar transistor, the collector is connected with the electric power source terminal and the emitter is connected with the pad. Incidentally, at least either of a first diode, a first resistor and a first longitudinal bipolar transistor or a second diode, a second resistor and a second longitudinal bipolar transistor may be provided.

A second practical example of an ESD protection apparatus of the present invention is as follows. The pad is an electric power source terminal. The longitudinal bipolar transistor is NPN type. Regarding the diode, the cathode is connected with the pad and the anode is connected with the base of the longitudinal bipolar transistor. A resistor is connected between the anode of the diode and a ground terminal. Regarding the longitudinal bipolar transistor, the collector is connected with the pad and the emitter is connected with the ground terminal.

An ESD protection apparatus of the present invention may has the following constitution. The trigger element comprises, as a diode to be broken down by overvoltage applied to the pad, a first longitudinal bipolar transistor whose collector and base work and which discharges the accumulated electric charge of the pad by being electrically communicated attributed to the breakdown of the diode. The ESD protection element comprises a second longitudinal bipolar transistor for discharging the accumulated electric charge of the pad by being electrically communicated attributed to the breakdown of the diode.

Practical examples of this case are as follows. The pad is an input terminal or an output terminal. The trigger element comprises an NPN type longitudinal bipolar transistor A and an NPN longitudinal bipolar transistor B working as the first longitudinal bipolar transistor and a first and a second resistors. The ESD protection element comprises an NPN type longitudinal bipolar transistor C and an NPN type longitudinal bipolar transistor D working as the second longitudinal bipolar transistor. Regarding the longitudinal bipolar transistors A, C, the collectors are connected with the pad and the bases are connected with each other and the emitters are connected with a ground terminal. The first resistor is connected between the bases of the longitudinal bipolar transistors A, C and the ground terminal. Regarding the longitudinal bipolar transistors B, D, the collectors are connected with an electric power source terminal and the bases are connected with each other and the emitters are connected with the pad. The second resistor is connected between the bases of the longitudinal bipolar transistors B, D and the pad.

The pad is an electric power source terminal. The first and second longitudinal bipolar transistors are NPN type and their collectors are connected with the pad and their bases are connected with each other and their emitters are connected with a ground terminal. A resistor is connected between the bases of the first and second longitudinal bipolar transistors and the ground terminal.

The conductive types P and N may be taken as reverse conductive types N and P, respectively. Even if the P and the N are reversed, the kind of a carrier alone is changed and naturally the same function can be realized. Incidentally, when the longitudinal bipolar transistor is taken as PNP type, the positions of the diode and the resistor are replaced with each other.

The diode may comprise a single diode or plural diodes connected in series, the overvoltage may be an forward voltage for the diode and the breakdown may be a substantial breakdown by being electrically discharged. The diode forward descending voltage is, compared with the breakdown voltage, hard to depend on high impurity concentration and a low voltage. Consequently, by selecting the number of diodes to be connected in series, a desired substantial breakdown voltage can be accurately set.

In the ESD protection apparatus according to the invention, the collector layers of the above described first longitudinal bipolar transistor and the above described second longitudinal bipolar transistor may be as simultaneously formed.

In the ESD protection apparatus according to the invention, the above described first longitudinal bipolar transistor and the above described second longitudinal bipolar transistor may have a common collector layer.

In the ESD protection apparatus according to the invention, the longitudinal bipolar transistor or the diode comprises all or some of: a first $N^-$ type well formed on the P type silicon substrate surface; a second $N^-$ type well adjacent to this first $N^-$ type well and formed on the P type silicon substrate surface; a second $N^+$ layer formed on this second $N^-$ type well surface; the $P^-$ type well formed on the first $N^-$ type well surface; the $P^+$ layer and a first $N^+$ layer formed on this $P^-$ type well surface apart from each other; the insulation material installed between these $P^+$ layer and the first $N^+$ layer for preventing the electric connection with the $P^+$ layer and the first $N^+$ layer, wherein the second $N^-$ type well and the $P^-$ type well may be insulated by the insulation material for isolation and the P type silicon substrate and the $P^-$ type well may be insulated by the insulation material for isolation. In this case, the conductive type P and N may be taken as the reverse conductive N and P, respectively.

In the ESD protection apparatus according to the invention, the $P^+$ layer and the first and second $N^+$ layers may be formed simultaneously with the $P^+$ layer and the $N^+$ layer of the CMOS transistor constituting the inner circuit.

In the ESD protection device according to the invention, a second $N^-$ type well may be formed simultaneously with the $N^-$ type well of the CMOS transistor constituting the inner circuit.

In the ESD protection device according to the invention, the insulation material may be a dummy gate or a mere insulation material formed simultaneously formed with the gate electrode and the gate insulation film of the CMOS transistor constituting the inner circuit. This dummy electrode or the insulation film may be formed in a ring shape on the silicon substrate surface.

In the ESD protection apparatus according to the invention, the diode may comprises: the $N^-$ type well formed on the P type silicon substrate surface; the $P^+$ layer and the $N^+$ layer formed on the $N^-$ type well surface apart from each other; and the insulation material formed in the inside from the above described P type silicon substrate surface between these $P^+$ layer and $N^+$ layer. In this case, in the ESD protection apparatus according to the invention, the conductive type P and N may be the reverse conductive type N and P, respectively.

In the ESD protection apparatus according to the invention, the diode comprises: the $N^-$ type well formed on the P type silicon substrate surface; the $P^-$ type well formed on this $N^-$ type well surface; the $P^+$ layer and the $N^+$ layer formed on this $P^-$ type well surface apart from each other; and the insulation material installed on the P type silicon substrate surface between these $P^+$ layer and $N^+$ layer, wherein the P type silicon substrate and the $P^-$ type well may be insulated by the insulation material for isolation. In this case, in the ESD protection apparatus according to the invention, the conductive type P and N may be taken as the reverse conductive type N and P, respectively.

An ESD protection apparatus of the present invention may further have the following constitution. The diode comprises a $P^-$ type well formed on the surface of a silicon substrate, an $N^+$ type layer and a $P^+$ type layer formed on the $P^-$ type well surface at an interval from each other, and a dummy gate electrode formed on the $P^-$ type well via an insulation film and between the $N^+$ type layer and the $P^+$ type layer and connected with a ground terminal. In this case, the electric field between the $N^+$ layer and the dummy gate electrode is intensified, the ESD trigger at a lower voltage. Incidentally, the conductive type P and N may be the reverse conductive type N and P, respectively.

A method for fabricating an ESD protection apparatus relevant to the present invention is a method for fabricating an ESD protection apparatus according to claim 1 and comprises the following steps. (1) A first step of simultaneously forming an $N^-$ type well of a CMOS transistor composing the inner circuit and an $N^-$ type well for connector connection to be connected with the collector of the longitudinal bipolar transistor on a P type silicon substrate. (2) A second step of simultaneously forming a collector $N^-$ type well to be a collector of the longitudinal bipolar transistor and an $N^-$ type well of the diode on the P type silicon substrate. (3) A third step of simultaneously forming a $P^-$ type layer to be a base in the collector $N^-$ type well of the longitudinal bipolar transistor and a $P^-$ type layer to be an anode in the $N^-$ type well of the diode. (4) A fourth step of simultaneously forming an $N^+$ type layer in the $P^-$ type well of the CMOS transistor, an $N^+$ type layer in the $N^-$ type well for collector connection of the longitudinal bipolar transistor, an $N^+$ type layer to be an emitter in the $P^-$ type layer of the longitudinal bipolar transistor, and an $N^+$ type layer to be a cathode in the $P^-$ type layer of the diode. (5) A fifth step of simultaneously forming a $P^+$ type layer on the $N^-$ type well of the CMOS transistor, a $P^+$ type layer on the $P^-$ type layer of the longitudinal bipolar transistor, and a $P^+$ type layer on the $P^-$ type layer of the diode. In this case, the method for fabricating the ESD protection apparatus according to the invention allows the anode and the cathode to be reversed.

An ESD protection apparatus relevant to the present invention can be fabricated simultaneously in the fabrication process of a CMOS transistor except the steps (2) and (3). Since the steps (2) and (3) comprise ion implantation in the same parts, required is only one sheet of mask to be added in the conventional CMOS transistor fabrication process.

Further, the ESD protection apparatus fabrication method may further comprise a step of forming a dummy gate electrode simultaneously with a gate electrode of the CMOS transistor in the region where the collector $N^-$ type well of the longitudinal bipolar transistor and $N^-$ type well of the diode are formed in the second step (2). Incidentally, the dummy gate electrode is to prevent connection between the $N^+$ type layers of the longitudinal bipolar transistor and the diode formed in the step (4) and the $P^+$ type layers of the longitudinal bipolar transistor and the diode formed in the step (5) in the subsequent steps. Alternatively, the ESD protection apparatus fabrication method may further comprise a step of forming an insulation layer which prevents connection between the $N^+$ type layers of the longitudinal bipolar transistor and the diode formed in the step (4) and the $P^+$ type layers of the longitudinal bipolar transistor and the diode formed in the step (5) in the subsequent steps. In the method for fabricating the ESD protection apparatus relevant to the present invention also, the conductive type P and N may be the reverse type N and P, respectively.

In other words, as a method for protecting a semiconductor device from electrostatic discharge (ESD), the present invention provides a structure of an ESD protection apparatus in which a trigger element working at a low voltage and a longitudinal bipolar transistor are formed employing a fabrication method mutually compatible with a conventional CMOSFET fabrication process and which prevents electric current concentration and provides high ESD withstand level by enabling the trigger element to work at a lower voltage at which the gate insulation film of a MOS transistor in the inside is not broken at the time when the electrostatic pulses are applied to the input/output pad or an electric power source pad and making the longitudinal bipolar transistor work by the triggered electric current, and releasing the large quantity of electric charge in the longitudinal direction of the silicon substrate and the present invention provides a method for fabricating an ESD protection apparatus with such a structure.

DETAILED DESCRIPTION OF THE PREFERRED EMBODIMENTS

Figure 1:
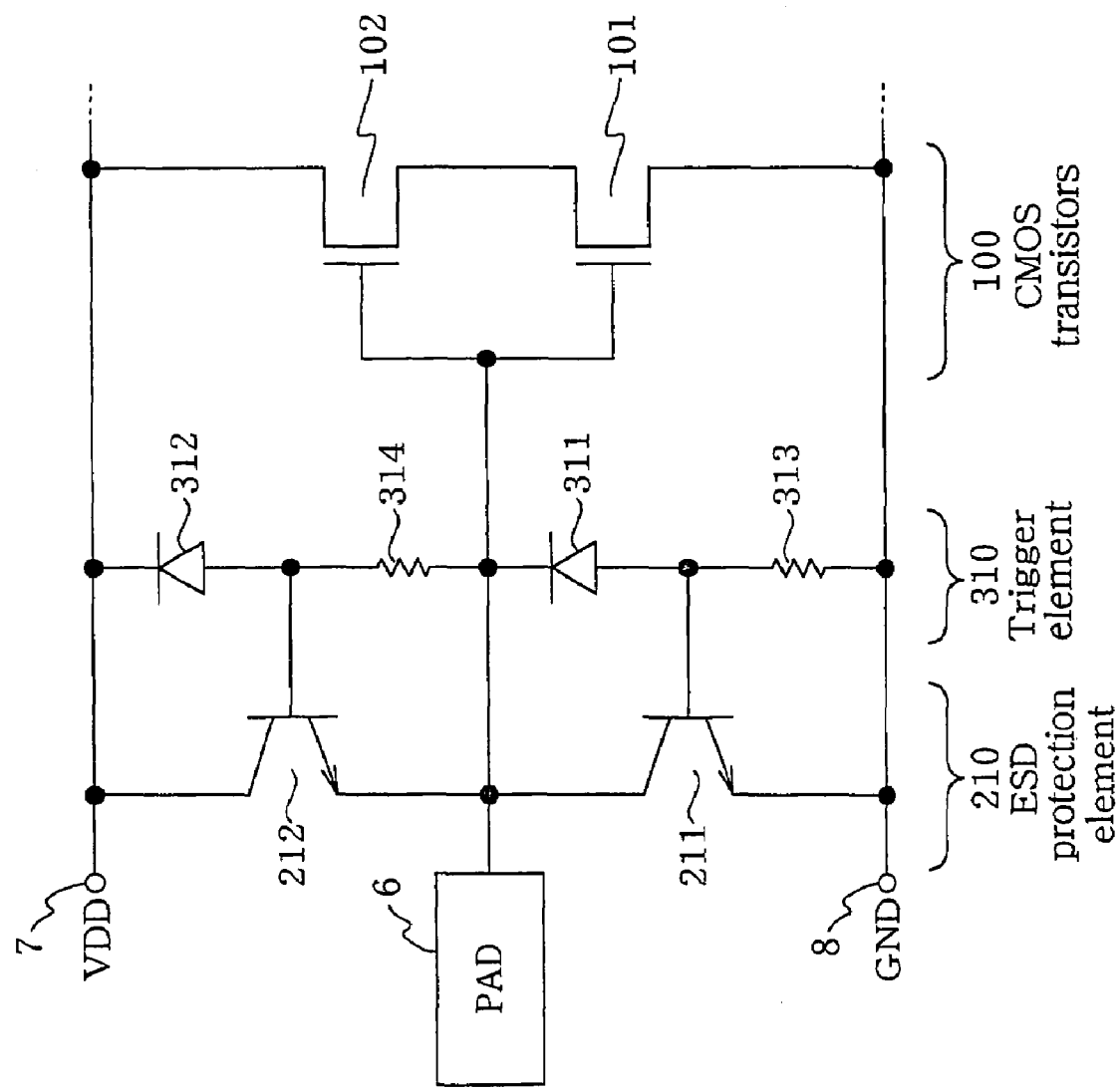
FIG. 1 is a circuit diagram illustrating a first embodiment of an ESD protection apparatus of the present invention.
Figure 2:
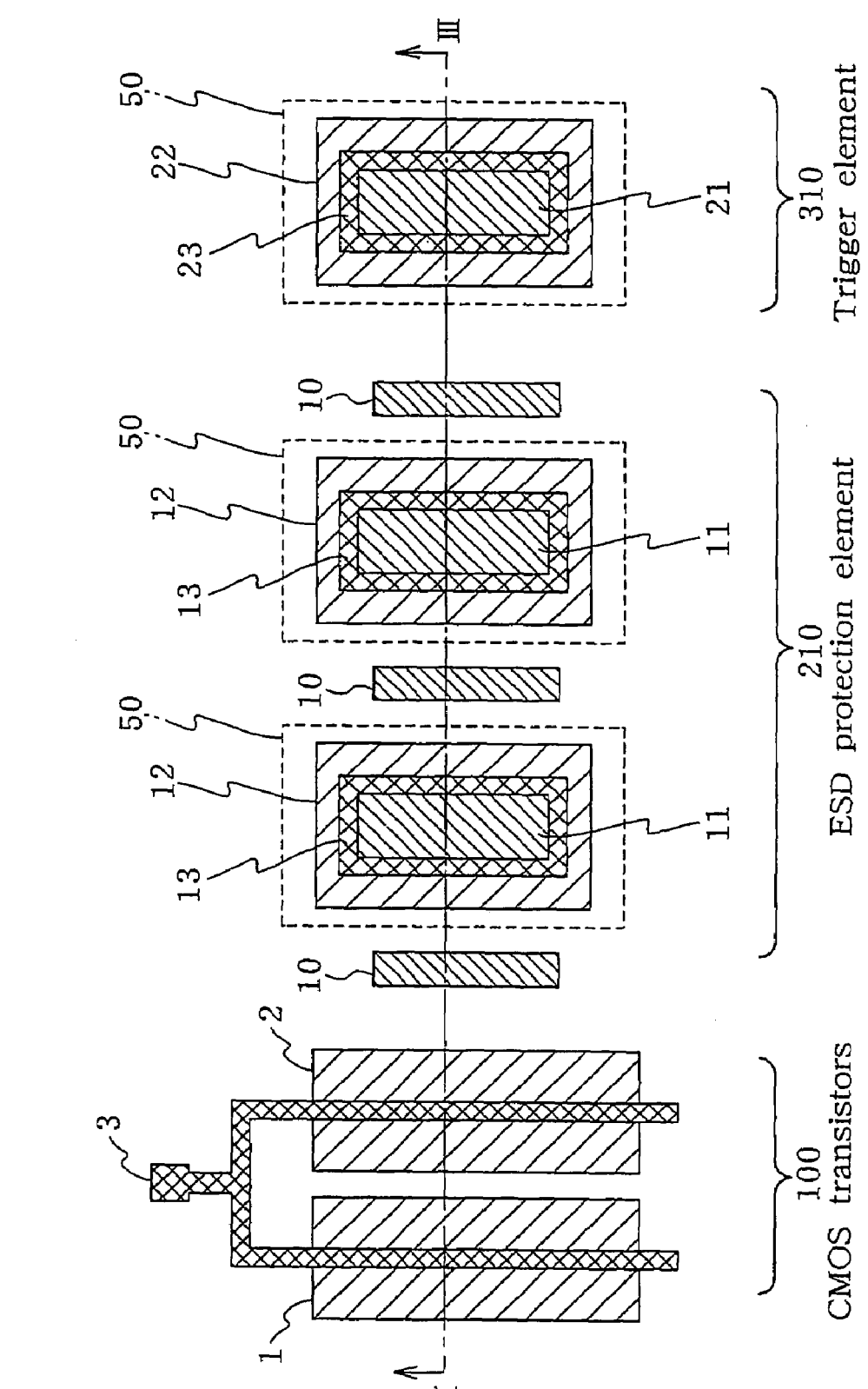
FIG. 2 is a plan view of the ESD protection apparatus of FIG. 1.
Figure 3:
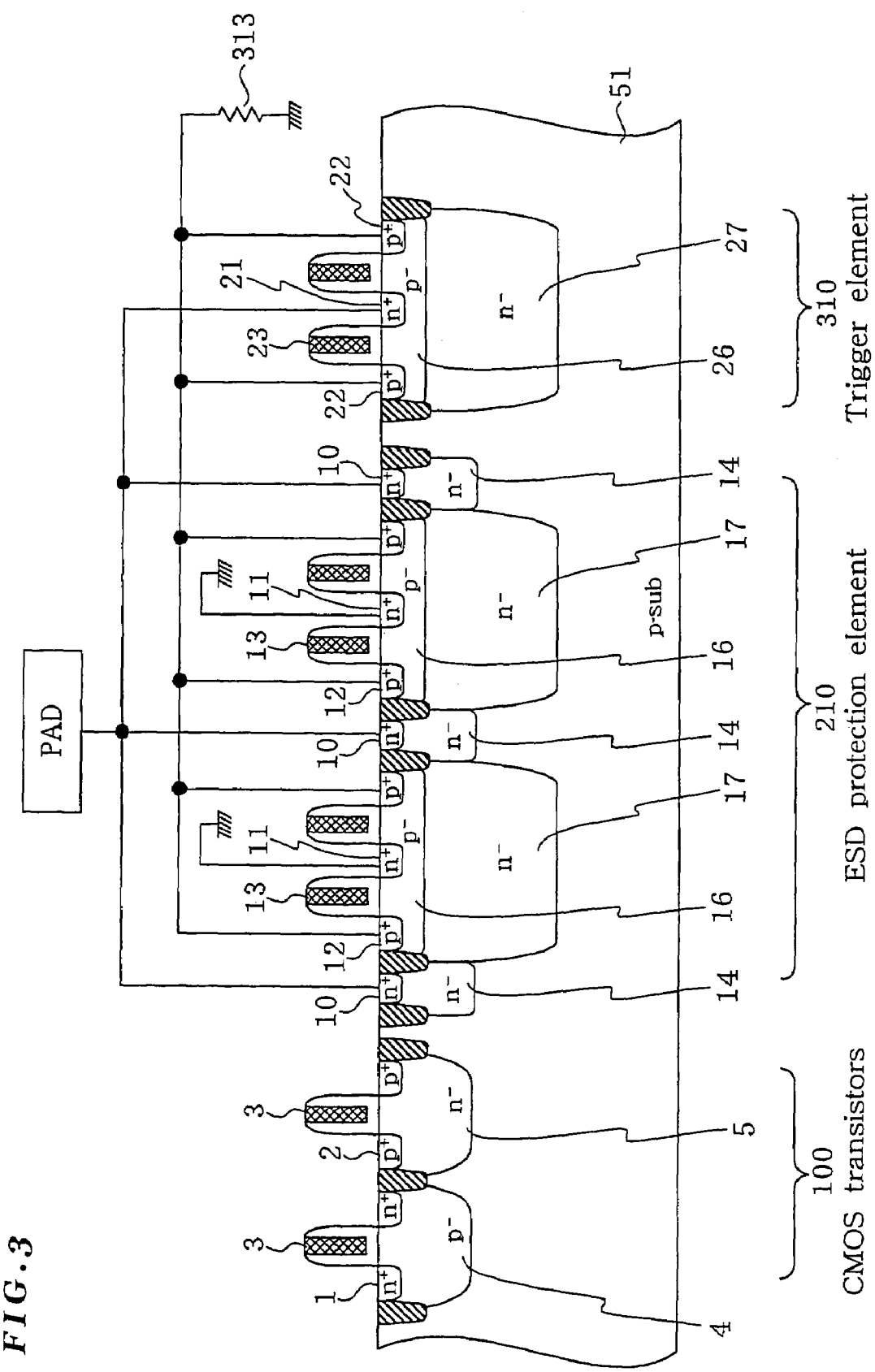
FIG. 3 is a longitudinal cross-section figure cut along the III-III line in FIG. 2.

FIG. 1 to FIG. 3 illustrates a first embodiment of an ESD protection apparatus relevant to the present invention and FIG. 1 is a circuit diagram, FIG. 2 is a plan view, and FIG. 3 is a longitudinal cross-section figure along the III-III line in FIG. 2. Hereinafter, description will be given with reference to these figures. The ESD protection apparatus of this embodiment works as an input buffer protection circuit.

The ESD protection apparatus of this embodiment is installed between an input terminal (an input pad) 6 of a semiconductor integrated circuit chip and a CMOS transistor 100 and comprises a trigger element 310 comprising diodes 311, 312 which are broken down by overvoltage applied to the input terminal 6 and an ESD protection element 210 comprising longitudinal bipolar transistors 211, 212 for discharging the accumulated electric charge of the input terminal 6 by being electrically discharged owing to the breakdown of the diodes 311, 312. Incidentally, FIG. 2 and FIG. 3 show only the longitudinal bipolar transistor 211 as some of ESD protection element 210 and only the diode 311 as some of the trigger element 310.

The CMOS transistor 100 is a CMOS inverter comprising an NMOS transistor 101 and a PMOS transistor 102. Regarding the diode 311, the cathode is connected with the input terminal 6 and the anode is connected with the base of the longitudinal bipolar transistor 211. Regarding the diode 312, the cathode is connected with an electric power terminal 7 and the anode is connected with the base of the longitudinal bipolar transistor 212. A resistor 313 is connected with the anode of the diode 311 and a ground terminal 8. A resistor 314 is connected between the anode of the diode 312 and the input terminal 6. The longitudinal bipolar transistors 211, 212 are both NPN type. Regarding the longitudinal bipolar transistor 211, the collector is connected with the input terminal 6 and the emitter is connected with the ground terminal 8. Regarding the longitudinal bipolar transistor 212, the collector is connected with electric power terminal 7 and the emitter is connected with the input terminal 6. The resistors 313, 314 are made of a singly crystal silicon, a polysilicon, a metal or the like formed in the same semiconductor integrated circuit chip.

Since today it has swiftly been promoted to make the gate insulation film of a CMOS transistor thinner, it is required for the ESD protection apparatus 210 to work at a lower voltage than that which the gate insulation film of the CMOS transistor 100 is broken. In this embodiment, the base potential of the longitudinal bipolar transistors 211, 212 is increased by voltage decreased at the time when the trigger current, which is the breakdown current of the diodes 311, 312, flows in the resistors 313, 314 to turn on longitudinal bipolar transistors 211, 212. Consequently, the large quantity of the electric charge attributed to the static electricity accumulated in the input terminal 6 is released in the longitudinal direction of the silicon substrate. As a result, electric current concentration can be prevented and a high ESD withstand level can be obtained.

To form the trigger element 310 comprising the ESD protection element 210 comprising longitudinal bipolar transistors 211, 212 and the diodes 311, 312 can be carried out by adding only one ion implantation mask in the common fabrication process of a CMOSFET. Hereinafter, the fabrication method will be described with the reference to FIG. 2 and FIG. 3.

At first, the ESD protection element 210 will be described. Simultaneously with the $N^+$ type diffusion layer 1 of the CMOS transistor 100, the collector lead parts 10 and the emitters 11 are formed and simultaneously with the $P^+$ type diffusion layer 2 of the CMOS transistor 100, the base lead parts 12 are formed. The dummy gate electrodes 13 formed simultaneously with the gate electrodes 3 of the CMOS transistor 100 are employed in order to separate the silicide of the emitters 11 and the base lead parts 12. The dummy gate electrodes 13 are not for applying potential but separate the silicide. Opening parts 50 are formed in a resist using an additional mask for ion implantation and ion implantation is carried out to simultaneously form the $P^-$ region bases 16 and the collector N wells 17. The collector N wells 17 formed at that time and the collector lead parts 10 formed separately are connected with each other by the N wells 14 for connection simultaneously formed with the N well 5 of the CMOS transistor 100. Consequently, longitudinal bipolar transistors can be fabricated utilizing the CMOS process. Incidentally, the ion implantation may be carried out either before or after of the formation of the gate electrodes 3.

The trigger element 310 will be described next. The $N^+P^-$ type diode has the same structure as the emitters 11 and bases 16 of the ESD protection element 210 and simultaneously with the $N^+$ type diffusion layer 1 of the CMOS transistor 100, the $N^+$ part 21 is formed and simultaneously with the $P^+$ type diffusion layer 2 of the CMOS transistor 100, the lead parts 22 of the $P^-$ parts 26 are formed. Consequently, it is enabled to set a desired trigger voltage and the leakage level in the opposed direction.

Figure 4:
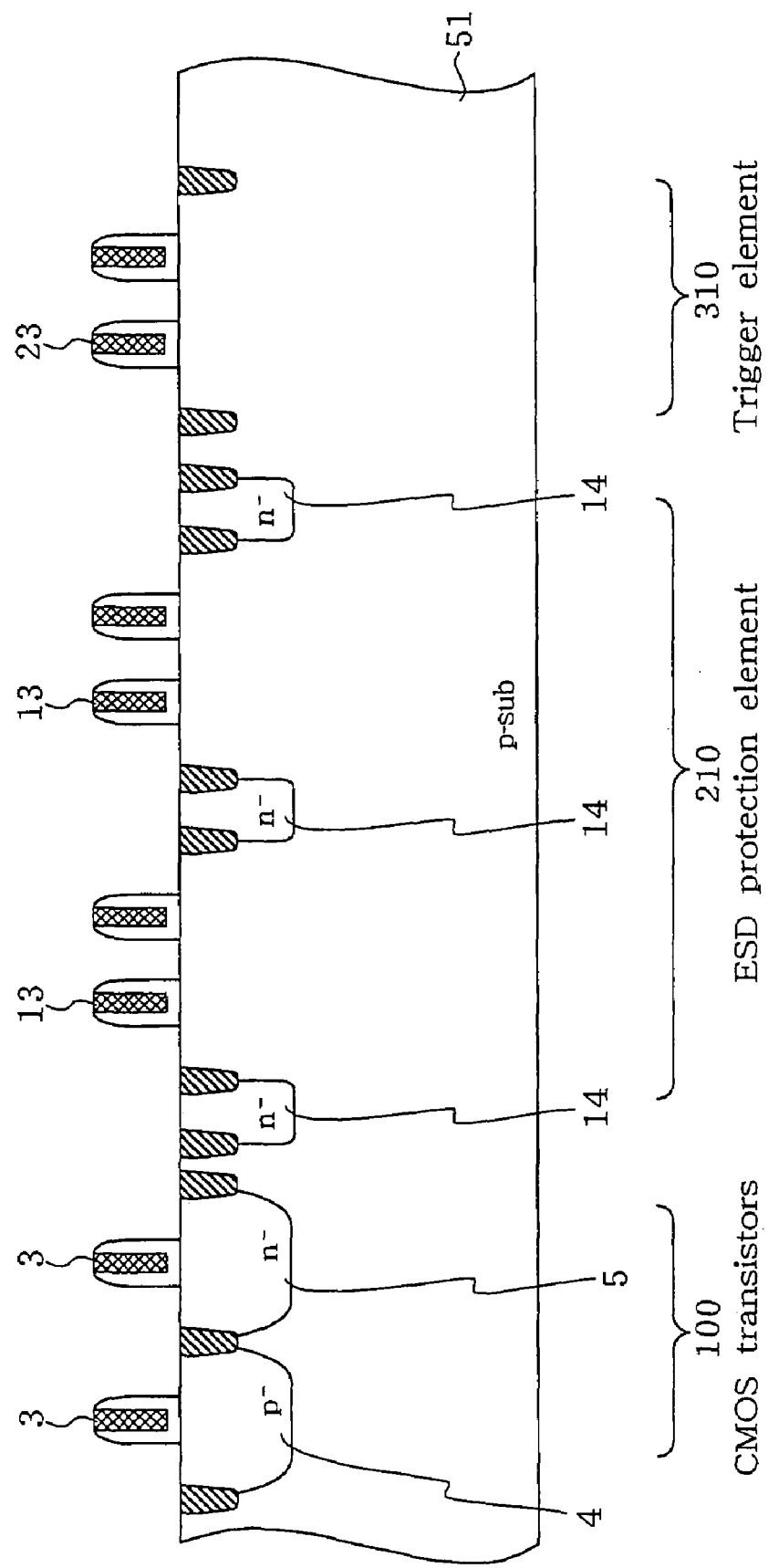
FIG. 4 is a cross-section figure showing the method for fabricating the ESD protection apparatus of FIG. 2 and FIG. 3.
Figure 5:
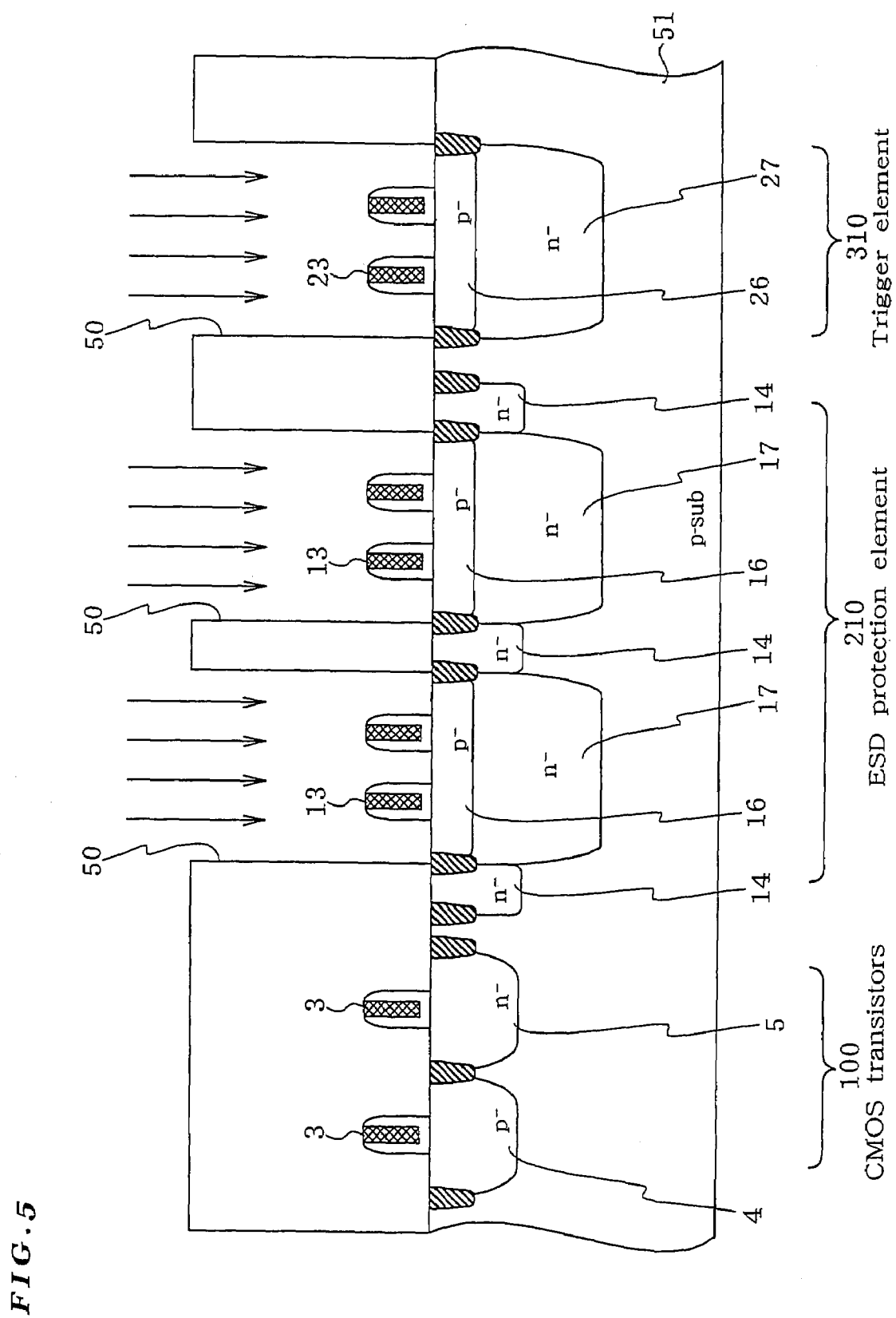
FIG. 5 is a cross-section figure showing the method for fabricating the ESD protection apparatus of FIG. 2 and FIG. 3.
Figure 6:
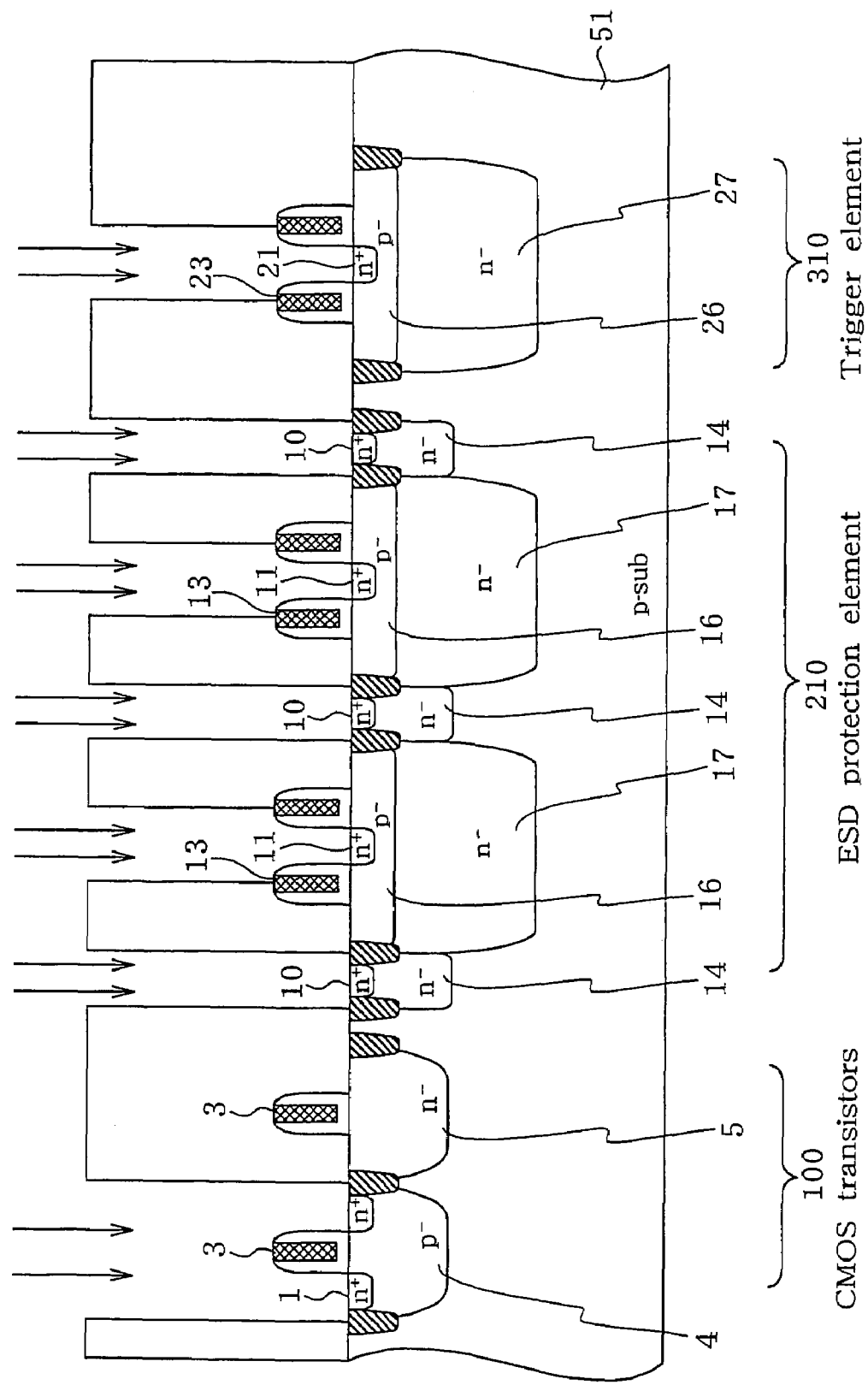
FIG. 6 is a cross-section figure showing the method for fabricating the ESD protection apparatus of FIG. 2 and FIG. 3.

FIG. 4 to FIG. 6 are cross-section illustrations illustrating the method for fabricating the ESD protection apparatus of this embodiment. Hereinafter, the method for fabricating the ESD protection apparatus of the present invention will be described in details.

At first, as illustrated in FIG. 4, simultaneously with formation of N well 5 of CMOS transistor 100, collector lead parts 10 and N wells 14 for connection of the ESD protection element 210 are formed. The doping concentration of these regions is about $10^{17}/cm^{-3}$ to $10^{18}/cm^{-3}$. Also, simultaneously with formation of the gate electrodes 3 of the CMOS transistor 100, the dummy gate electrodes 13 of the ESD protection element 210 and a dummy gate electrode 23 of the trigger element 310 are formed. That is for preventing the emitters 11 and the base lead parts 12 of the ESD protection element 210 from being connected with the silicide formed later on the diffusion layer. In the same manner, that is for preventing the $N^+$ part 21 and the lead parts 22 of trigger element 310 from being connected with the silicide later.

Successively, using opening parts 50 of a resist with a prescribed shape as a mask as illustrated in FIG. 5, ion implantation in about $10^{18}/cm^{-3}$ dose is carried out to form the bases 16 of the ESD protection element 210 and continuously ion implantation in about $10^{18}/cm^{-3}$ dose is carried out to form the collector N wells 17. At that time, the $P^-$ part 26 and the N well 27 of the trigger element 310 are simultaneously formed.

Successively, as illustrated in FIG. 6, simultaneously with formation of the $N^+$ type diffusion layer 1 of the CMOS transistors 100, the collector lead parts 10, emitters 11, $N^+$ parts 21, and the like are formed.

Successively, as illustrated in FIG. 3, simultaneously with the P+ type diffusion layer 2 of the CMOS transistors 100, the base lead parts 12 and lead parts 22 are formed. Finally, wirings are formed on these upper layers to form a circuit as illustrated in FIG. 1.

Next, the operation of the ESD protection apparatus of this embodiment will be described with the reference to FIG. 1 and FIG. 3.

The following description is of the operation at the time when the electrostatic pulses are applied to the input terminal 6. At first, when pulses of positive ESD relative to the ground terminal 8 are applied to the input terminal 6, high voltage is applied to the ESD protection element 210, trigger element 310, and the gate insulation film of the CMOS transistors 100. Therefore, it is required to release the electric charge by ESD by operation of the ESD protection element 210 before the gate insulation film of the CMOS transistors 100 is broken down.

If the gate insulation film of the CMOS transistors 100 is 4 nm, the gate insulation film is broken by stress of constant voltage of about 8V. That is, it is required for the ESD protection element 210 to operate at a voltage lower than that. However, in the case where the ESD protection element 210, which comprises longitudinal bipolar transistors, is formed, since the withstand voltage between the collector N wells 17 and the P⁻ region bases 16 are about as high as 10V, it is insufficient to protect the CMOS transistors 100 whose gate insulation film is thin and fine only by the ESD protection element 210.

Hence, it is required to form the trigger element 310 which operates at a voltage as low as possible and not lower than the electric power source voltage. Since the P⁻ part 26 of the trigger element 310 is formed by ion implantation, a desired trigger voltage or leakage level in the opposed direction can be set by controlling the dose quantity and it is easy to obtain trigger voltage of about 4 V.

Figure 7:
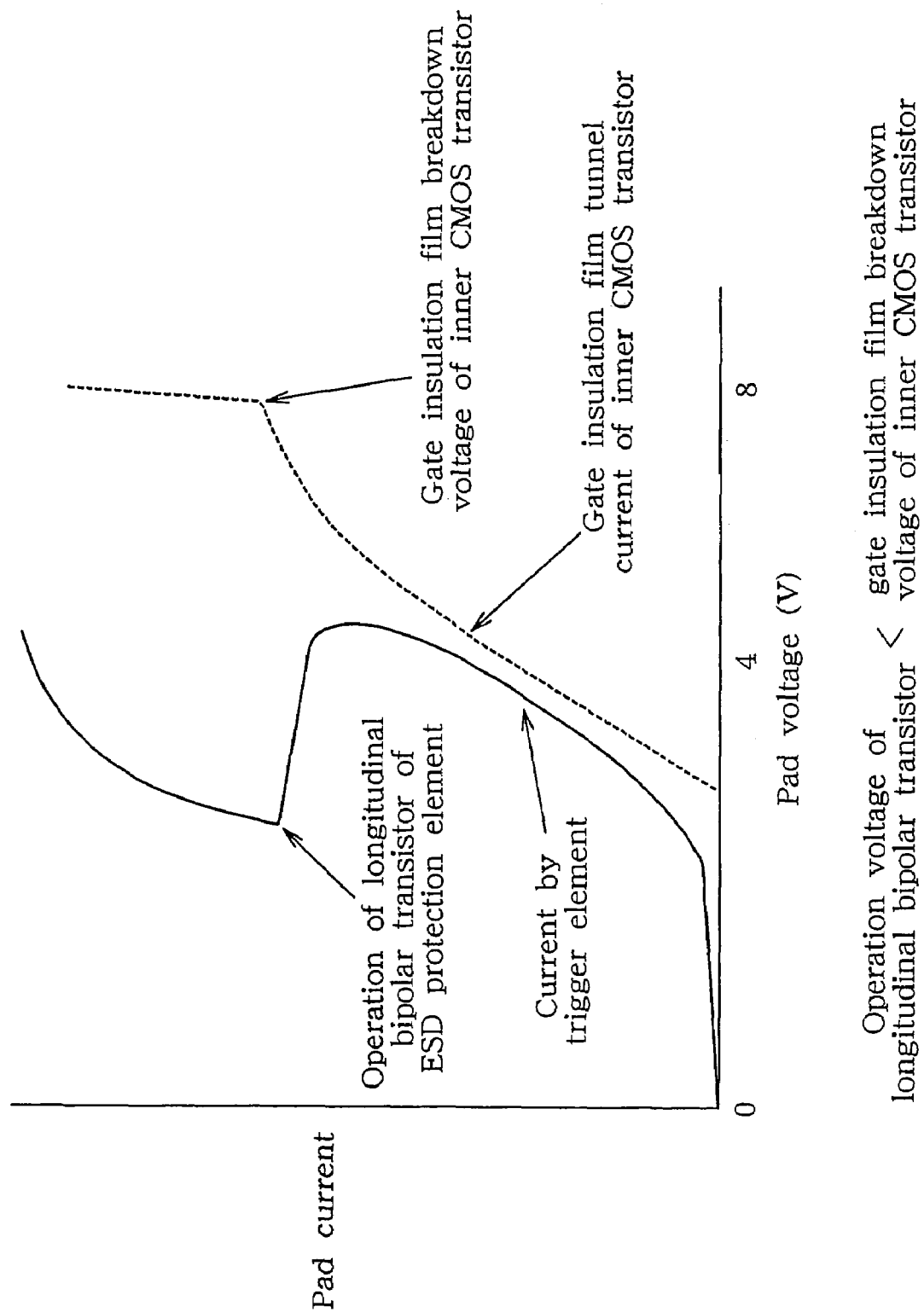
FIG. 7 is a graph showing the voltage-ampere characteristic in case of applying electrostatic pulses of ESD to the pad in the ESD protection apparatus of FIG. 1.

FIG. 7 shows the voltage-ampere characteristic in case of electrostatic pulses application to the pad. At first, when the trigger element 310 works at about 4 V, the resultant trigger current and the resistor 313 increase the base potential of the ESD protection element 210 to start the ESD protection element 210. When the ESD protection element 210 starts working, the electric charge applied to the input terminal 6 by the ESD can be released to the ground terminal 8 through the longitudinal bipolar transistor 211. Consequently, if the withstand voltage of the gate insulation film of the inner circuits of the CMOS transistors 100 is 8 V, the electric charge can be released at a lower voltage than that, so that the breakdown of the gate insulation film can be prevented.

Further, when pulses of negative ESD are applied to the input terminal 6 in relation to the ground terminal 8, since the collector N wells 17 and the P substrate 51 of the ESD protection element 210 shown in FIG. 3 are in N⁺/P⁻ normal direction, electric charge can smoothly be released.

Figure 8:
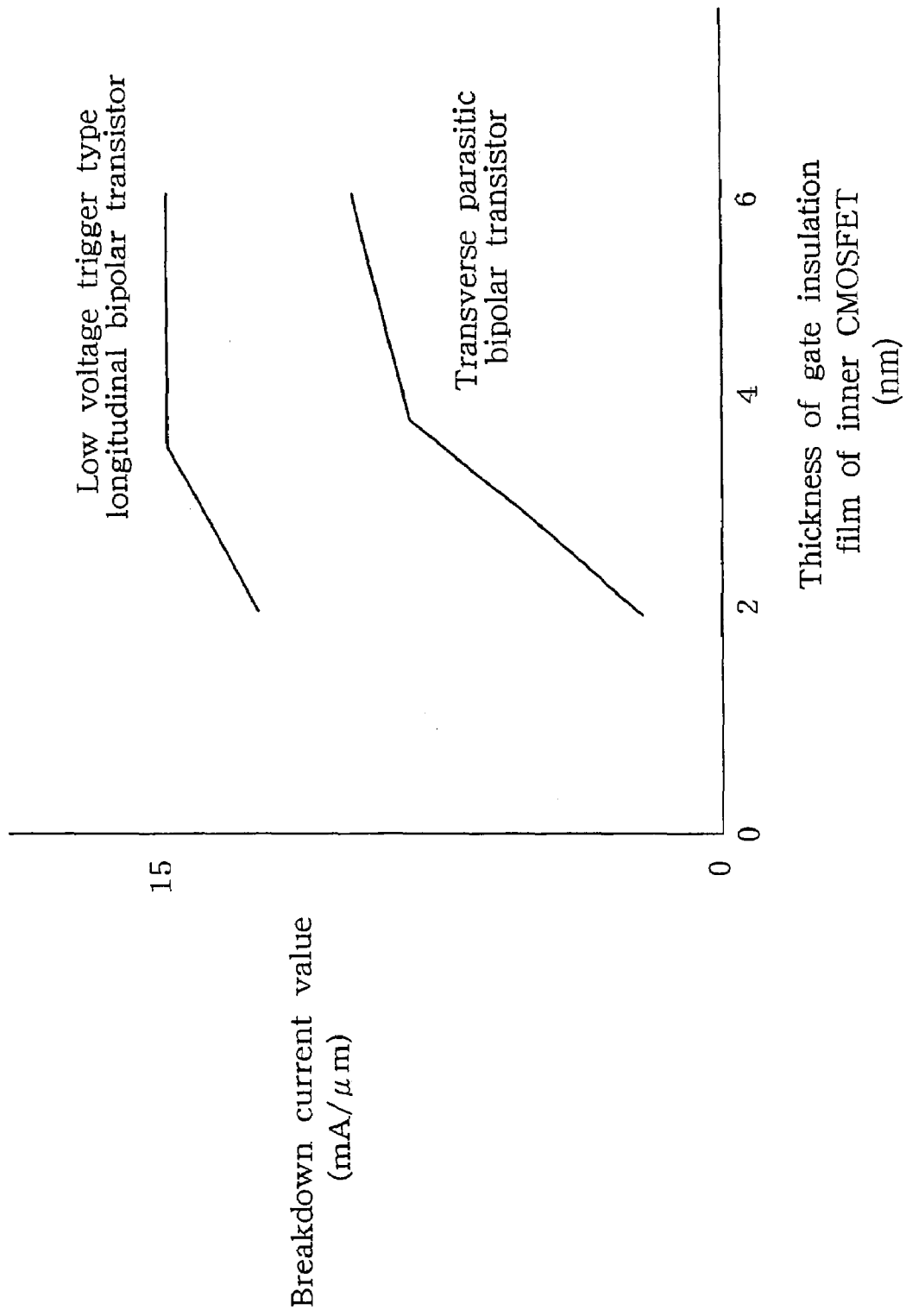
FIG. 8 is a graph showing the breakdown current values per unit length in case of using the ESD protection apparatus of FIG. 1 and in case of using a transverse parasitic bipolar transistor, a conventional MOS transistor.

FIG. 8 shows the breakdown electric current values per unit length in case of using the ESD protection apparatus of the present invention and in case of using a transverse parasitic bipolar transistor, which is a conventional MOS transistor. The breakdown electric current of the ESD protection element of this embodiment comprising longitudinal bipolar transistors is higher than that of an ESD protection element comprising transverse bipolar transistors. Also, if the inner gate insulation film is as thin as about 2 nm, the breakdown electric current is sharply lowered in case of the transverse bipolar transistors, the decrease is slight in case of the longitudinal bipolar transistors.

Figure 9:
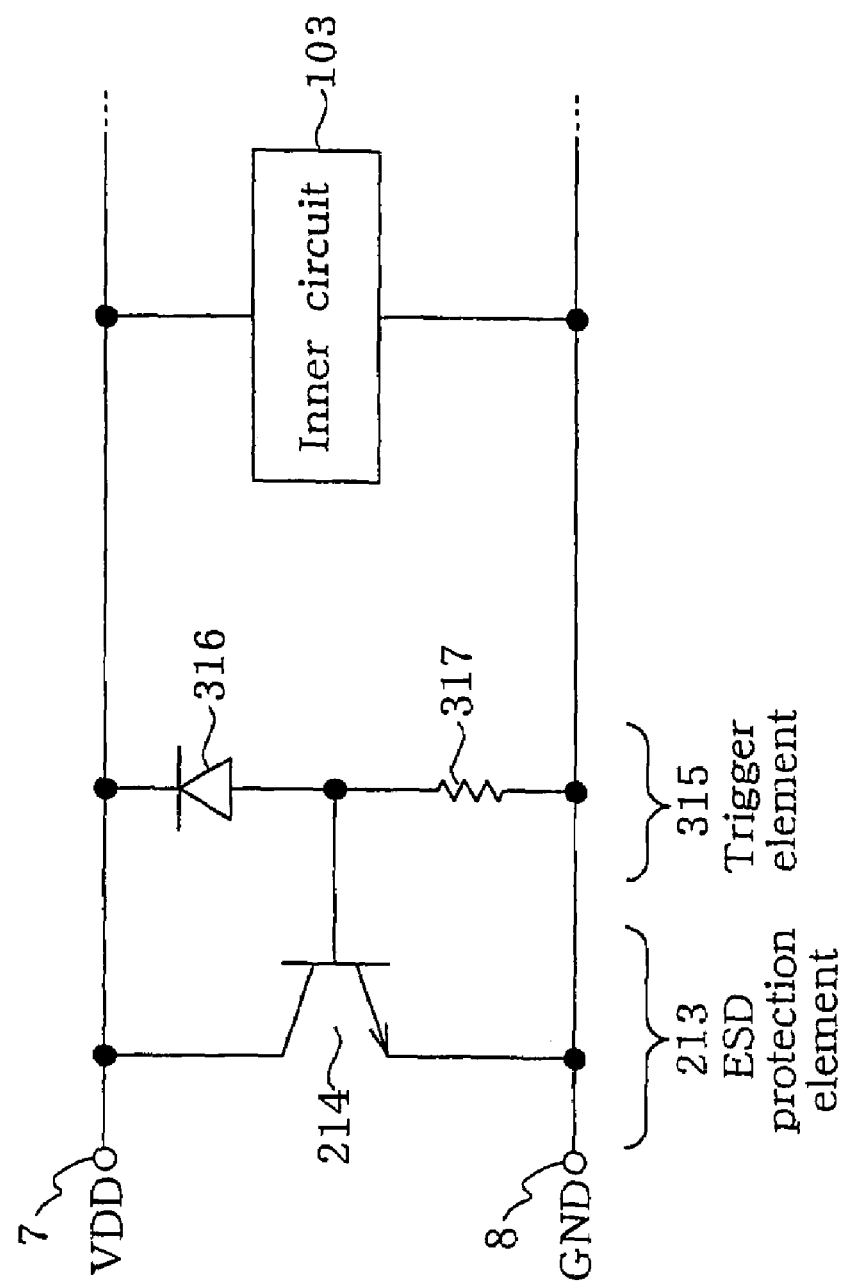
FIG. 9 is a circuit diagram illustrating a second embodiment of an ESD protection apparatus of the present invention.

FIG. 9 is a circuit diagram showing a second embodiment of an ESD protection apparatus relevant to the present invention. Hereinafter, description will be given with reference to the figure. The ESD protection apparatus of this embodiment works as an electric power source protection circuit.

The ESD protection apparatus of this embodiment is installed between an electric power terminal (an electric power pad) 7 of a semiconductor integrated circuit chip and an inner circuit 103 and comprises a trigger element 315 comprising a diode 316 to be broken down by overvoltage applied to the electric power terminal 7 and an ESD protection element 213 comprising a longitudinal bipolar transistor 214 for discharging the accumulated electric charge of the electric power terminal 7 by being electrically discharged owing to the breakdown of the diode 316.

Regarding the diode 316, the cathode is connected with the electric power terminal 7 and the anode is connected with the base of the longitudinal bipolar transistor 214. A resistor 317 is connected between the anode of the diode 316 and a ground terminal 8. Regarding the longitudinal bipolar transistor 214, it is NPN type, and the collector is connected with the electric power terminal 7 and the emitter is connected with the ground terminal 8.

The plan view and the cross-section figure are same as FIG. 2 and FIG. 3 except the reference numerals. Consequently, the ESD protection apparatus of this embodiment also performs the same functions and effects.

Figure 10:
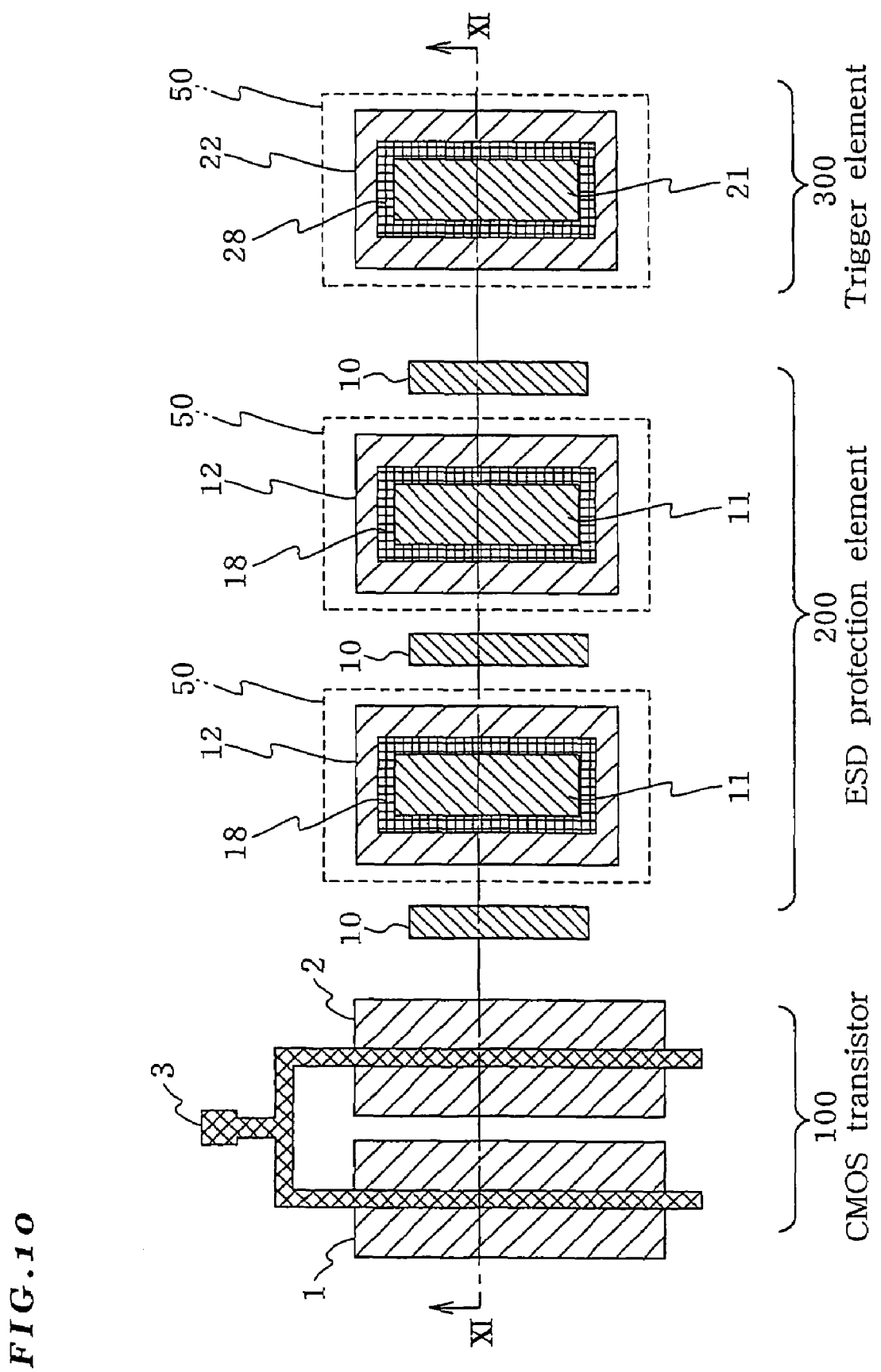
FIG. 10 is a plan view illustrating a third embodiment of an ESD protection apparatus of the present invention.
Figure 11:
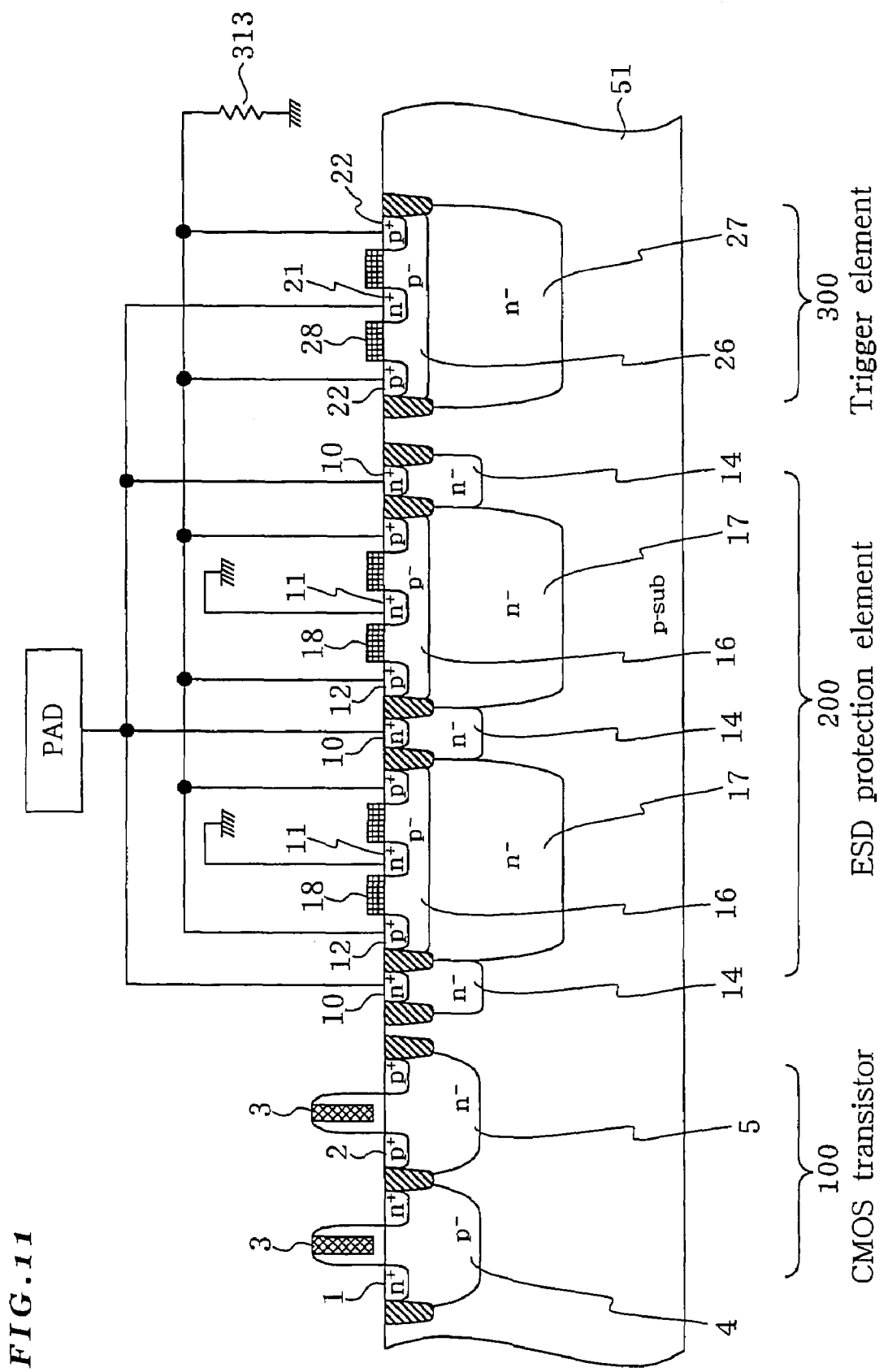
FIG. 11 is a longitudinal cross-section figure cut along the XI-XI line in FIG. 10.

FIG. 10 to FIG. 15 illustrate a third embodiment of an ESD protection apparatus relevant to the present invention. FIG. 10 shows a plan view, FIG. 11 shows the longitudinal cross-section figure cut along the XI-XI line in FIG. 10, and FIG. 12 to FIG. 15 show the cross-section figures illustrating the fabrication method. Hereinafter, description will be given with reference to these figures. Incidentally, the same reference numerals are assigned to these same as the parts in FIG. 2 and FIG. 6 and their description is omitted.

The ESD protection apparatus of this embodiment is an example in which insulation films 18, 28 (SiO₂ or SiN) covering the diffusion layer as to prevent silicide formation are used for resistor element formation in place of the dummy gate electrodes 13, 23 for silicide separation (in FIG. 2 and FIG. 3).

Figure 12:
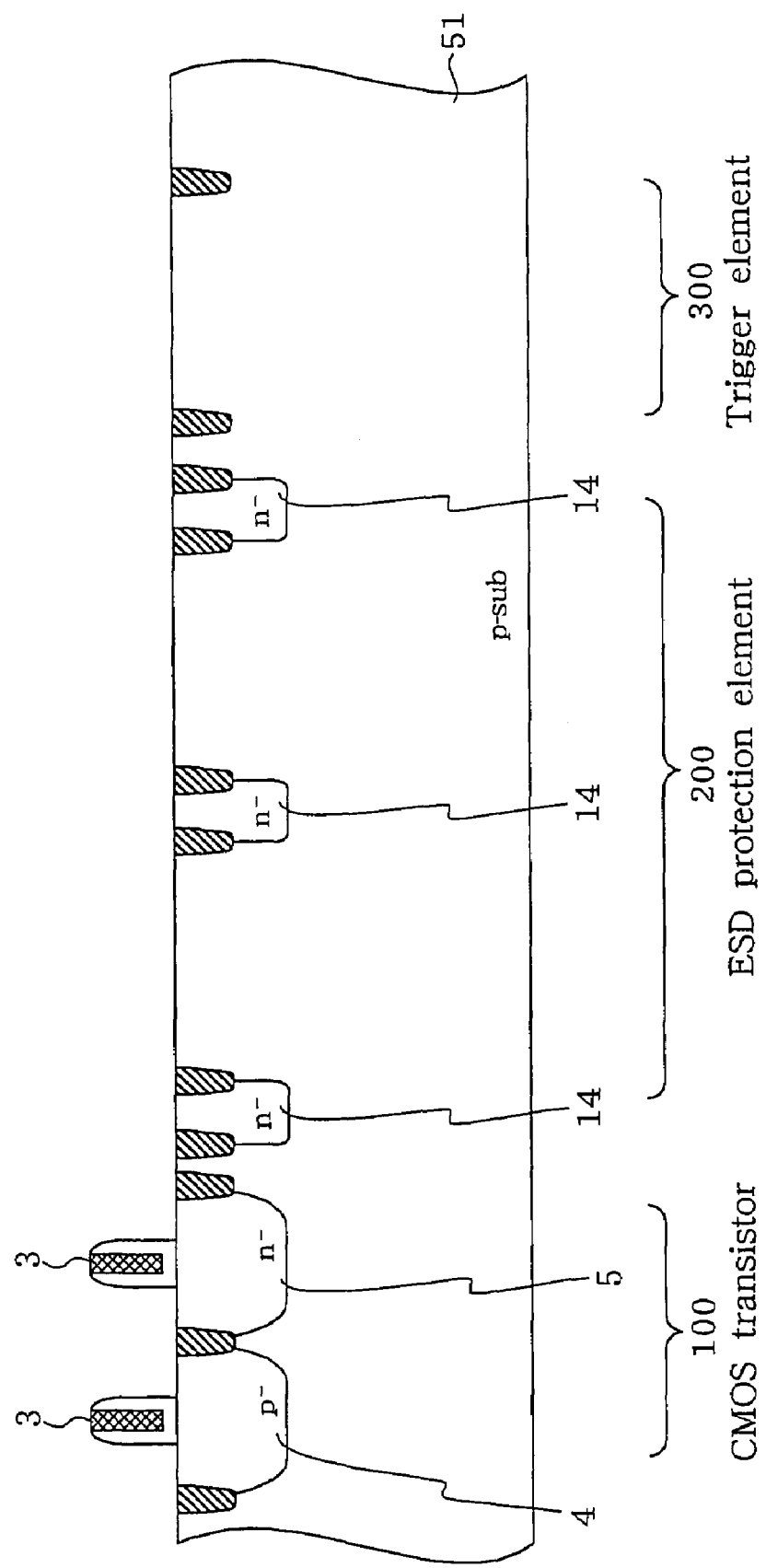
FIG. 12 is a cross-section figure showing the method for fabricating the ESD protection apparatus of FIG. 10 and FIG. 11.

At first, as illustrated in FIG. 12, simultaneously with formation of the N well 5 of the CMOS transistors 100, the N well 14 for connection with the collector lead parts 10 of the ESD protection element 200 is formed.

Figure 13:
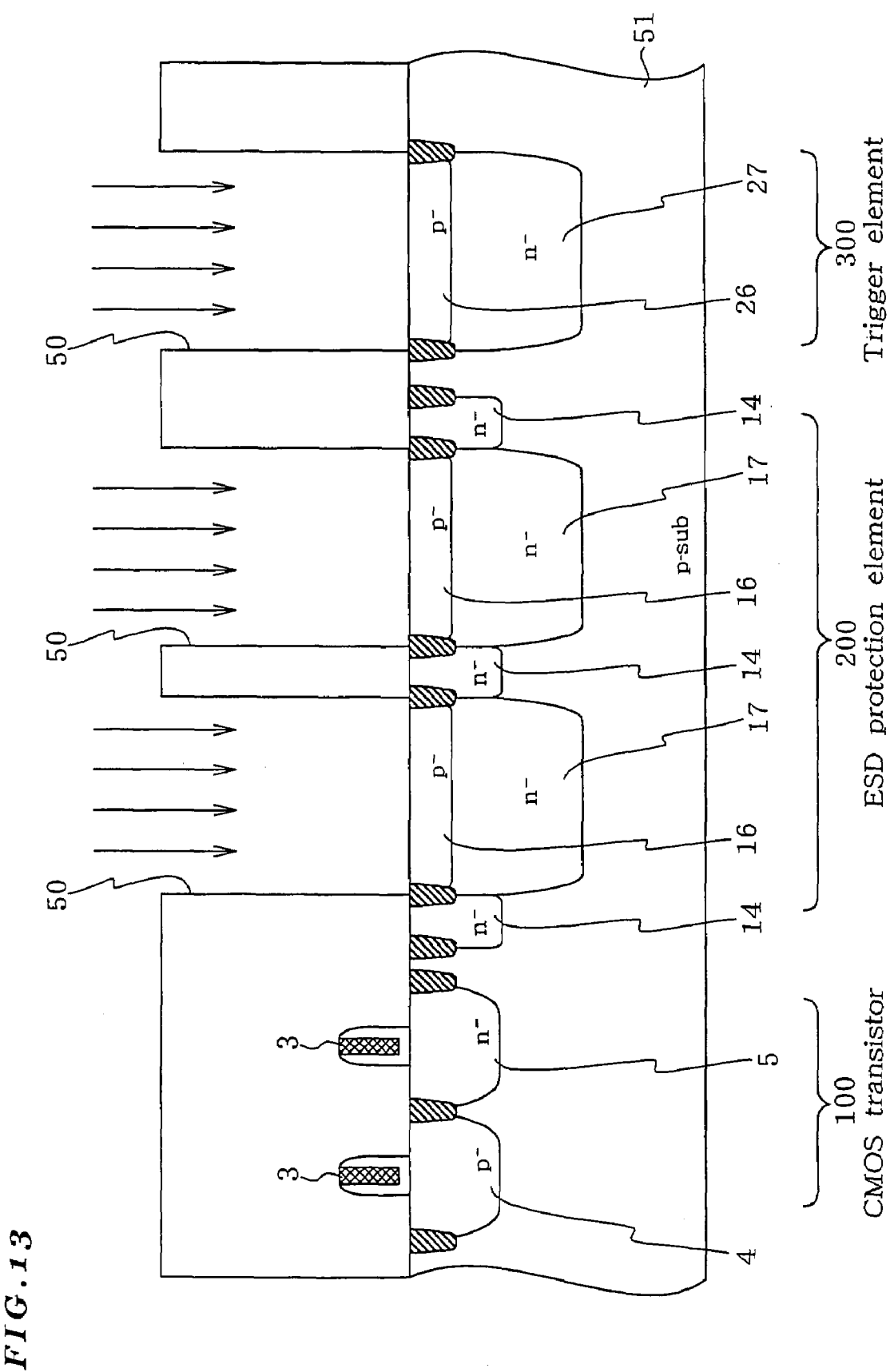
FIG. 13 is a cross-section figure showing the method for fabricating the ESD protection apparatus of FIG. 10 and FIG. 11.

Successively, as illustrated in FIG. 13, using opening parts 50 of a resist with a prescribed shape as a mask, ion implantation is carried out to form the bases 16 of the ESD protection element 200 and continuously ion implantation is carried out to form the collector N wells 17. At that time, the P⁻ part 26 and the N well 27 of the trigger element 300 are simultaneously formed.

Figure 14:
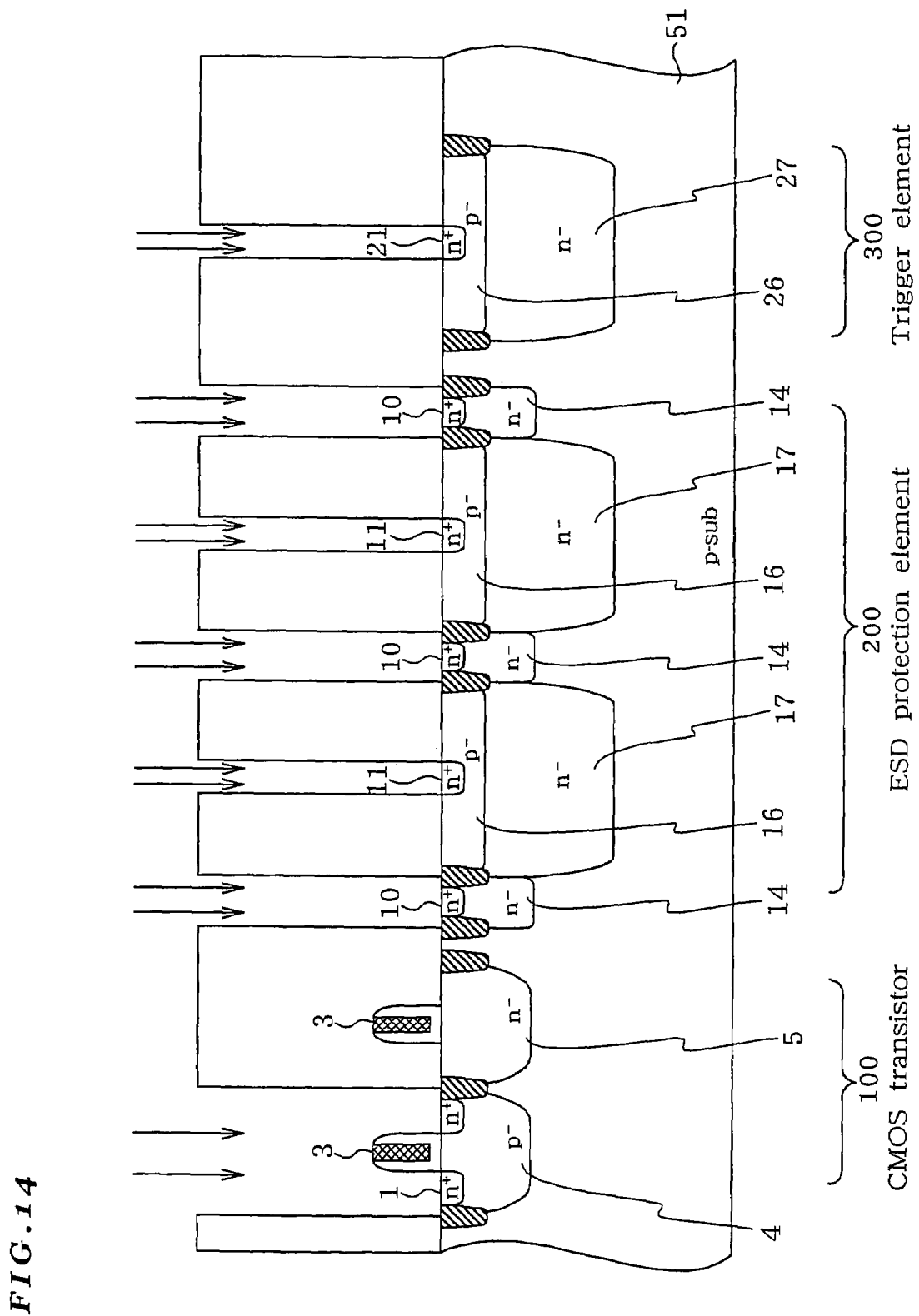
FIG. 14 is a cross-section figure showing the method for fabricating the ESD protection apparatus of FIG. 10 and FIG. 11.

Successively, as illustrated in FIG. 14, simultaneously with formation of the N⁺ type diffusion layer 1 of the CMOS transistors 100, the collector lead parts 10, emitters 11, N⁺ parts 21, and the like are formed.

Figure 15:
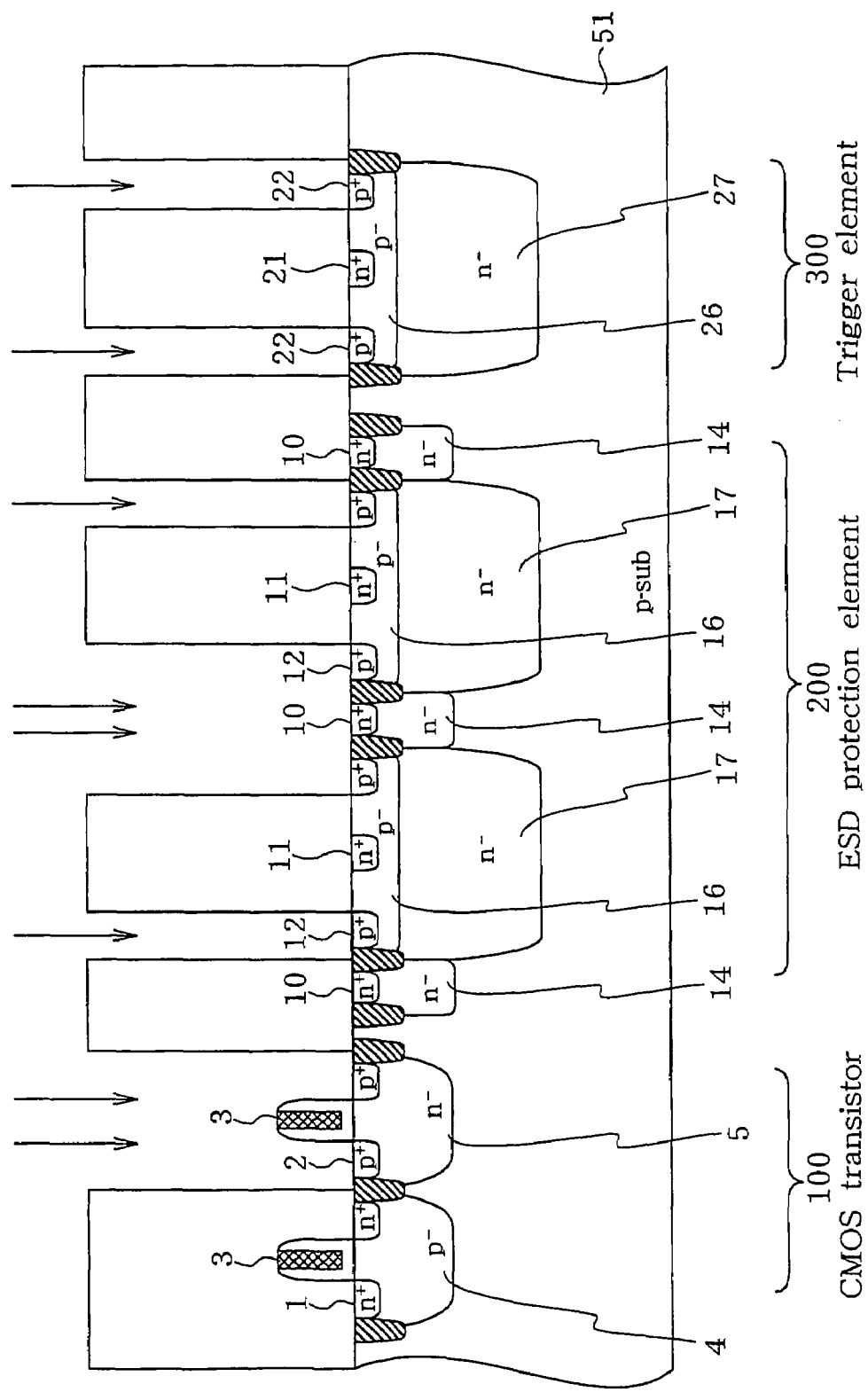
FIG. 15 is a cross-section figure showing the method for fabricating the ESD protection apparatus of FIG. 10 and FIG. 11.

Successively, as illustrated in FIG. 15, simultaneously with the P⁺ type diffusion layer 2 of the CMOS transistors 100, the base lead parts 12, lead parts 22, and the like are formed.

Successively, as illustrated in FIG. 11, the insulation film 18 in ESD protection element 200 and the insulation film 28 in the trigger element 310 are formed. That is for preventing the connection of the emitters 11 and the base lead parts 12 of ESD protection element 200 with each other by the silicide formed in the diffusion layer thereafter. Simultaneously, that is also for preventing the connection of the N+ part 21 and the lead parts 22 of trigger element 300 with each other by the silicide.

Finally, wirings are formed on these upper layers to form a circuit as illustrated in FIG. 1.

Figure 16:
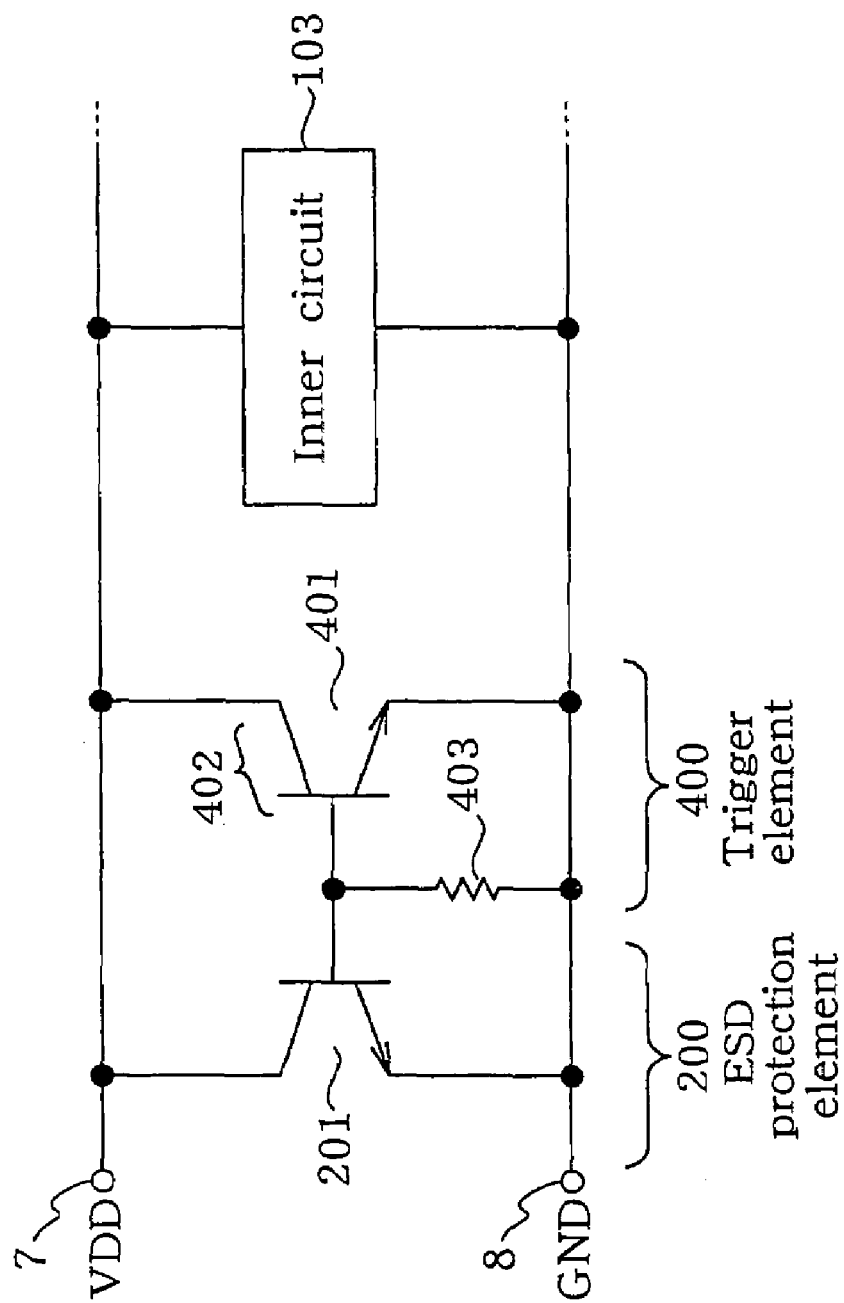
FIG. 16 is a circuit diagram illustrating a fourth embodiment of an ESD protection apparatus of the present invention.
Figure 17:
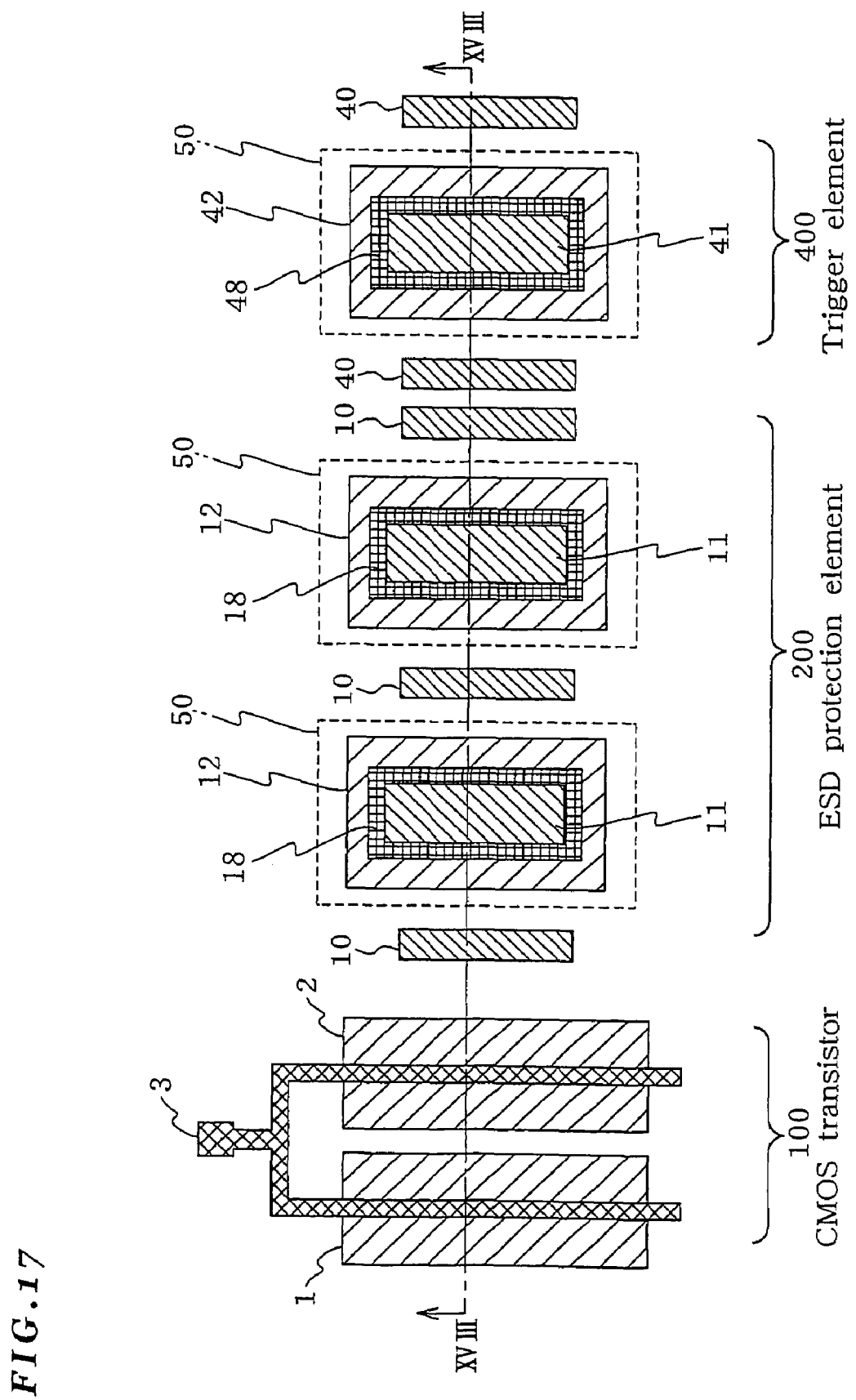
FIG. 17 is a plan view of the ESD protection apparatus in FIG. 16.
Figure 18:
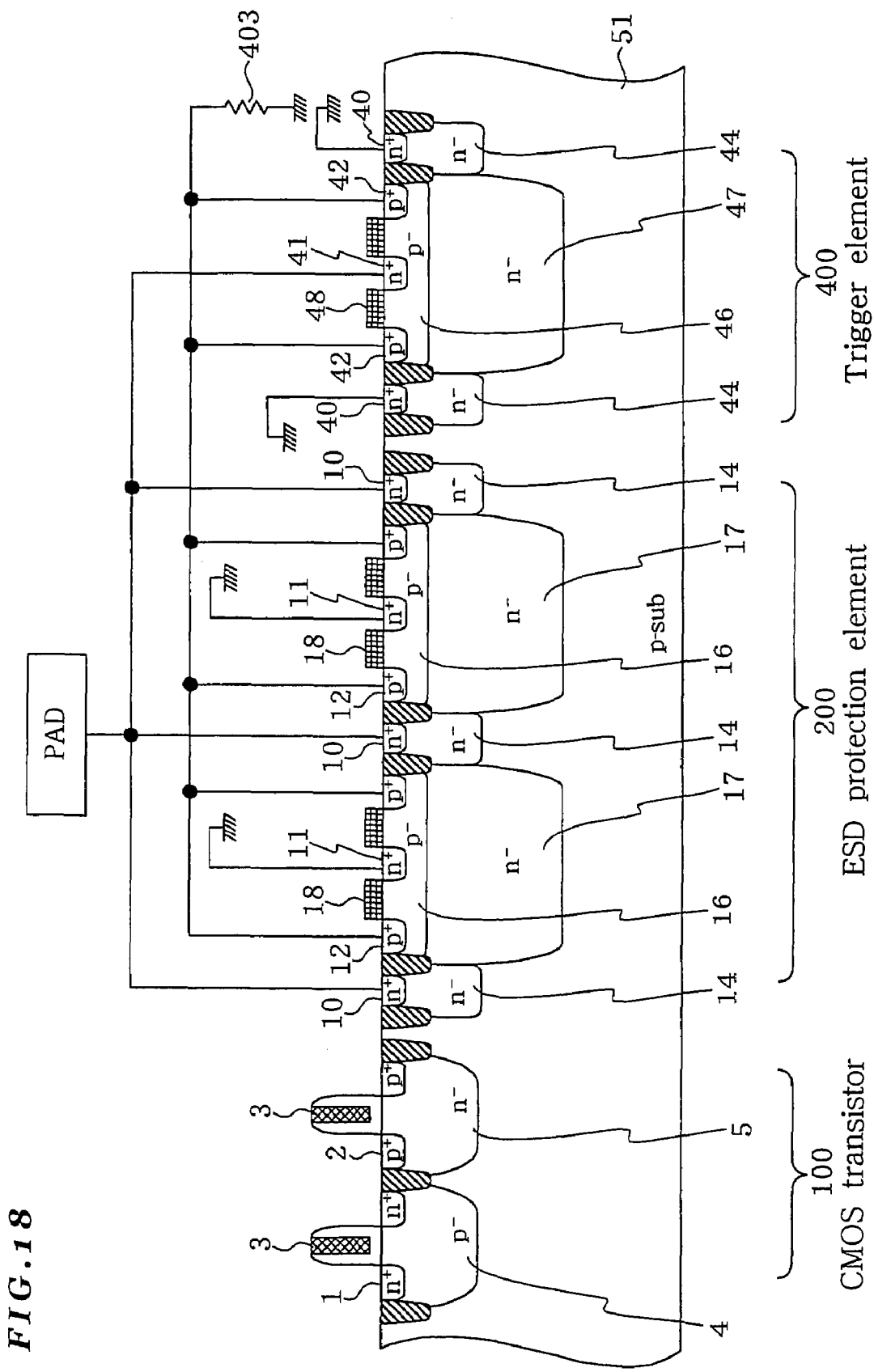
FIG. 18 is a longitudinal cross-section figure cut along the XVIII-XVIII line in FIG. 17.

FIG. 16 to FIG. 18 illustrate a fourth embodiment of an ESD protection apparatus relevant to the present invention. FIG. 16 shows a circuit diagram, FIG. 17 shows a plan view, and FIG. 18 shows the longitudinal cross-section figure cut along the XVIII-XVIII line in FIG. 17. Hereinafter, description will be given with reference to these figures. In the ESD protection apparatus of this embodiment, the trigger element is also used as a longitudinal bipolar transistor of the ESD protection element.

The ESD protection apparatus of this embodiment is installed between an, electric power terminal (an electric power pad) 7 of a semiconductor integrated circuit chip and an inner circuit 103 and comprises a trigger element 400 comprising a diode 402 to be broken down by overvoltage applied to the electric power terminal 7 and an ESD protection element 200 comprising a longitudinal bipolar transistor 201 for discharging the accumulated electric charge of the electric power terminal 7 by being electrically discharged owing to the breakdown of the diode 402.

The diode 402 is between the collector and the base of the longitudinal bipolar transistor 401. The cathode of the diode 402, which the collector of the longitudinal bipolar transistor 401, is connected with the electric power terminal 7 and the anode of the diode 402, which is the base of the longitudinal bipolar transistor 401, is connected with the base of the longitudinal bipolar transistor 201. A resistor 403 is connected between the anode of the diode 402, which is the base of the longitudinal bipolar transistor 401, and a ground terminal 8. Regarding the longitudinal bipolar transistors 201, 402, they are NPN type, and the collector is connected with the electric power terminal 7 and the emitter is connected with the ground terminal 8.

In this embodiment, emitter lead parts 40 are formed in the trigger element 400 and connected as illustrated in FIG. 16 and FIG. 18. By connecting in such a manner, the longitudinal bipolar transistor 401 is formed in the trigger element 400 and the trigger element 400 can work as an ESD protection element. The base potential of the longitudinal bipolar transistors 201, 401 is increased by the trigger current of the diode 402 composed of the N+ part (the collector) 41 and the P− part (the base) 46 of the trigger element 400 and the resistor 403 and owing the cooperation, the electric charge attributed to the static electricity accumulated in the electric power terminal 7 can be released by both of them. Incidentally, although the ESD protection apparatus of this embodiment is employed as the electric power pad, it may be also employed as an input pad or an output pad by installing two as same in the first embodiment.

Figure 19:
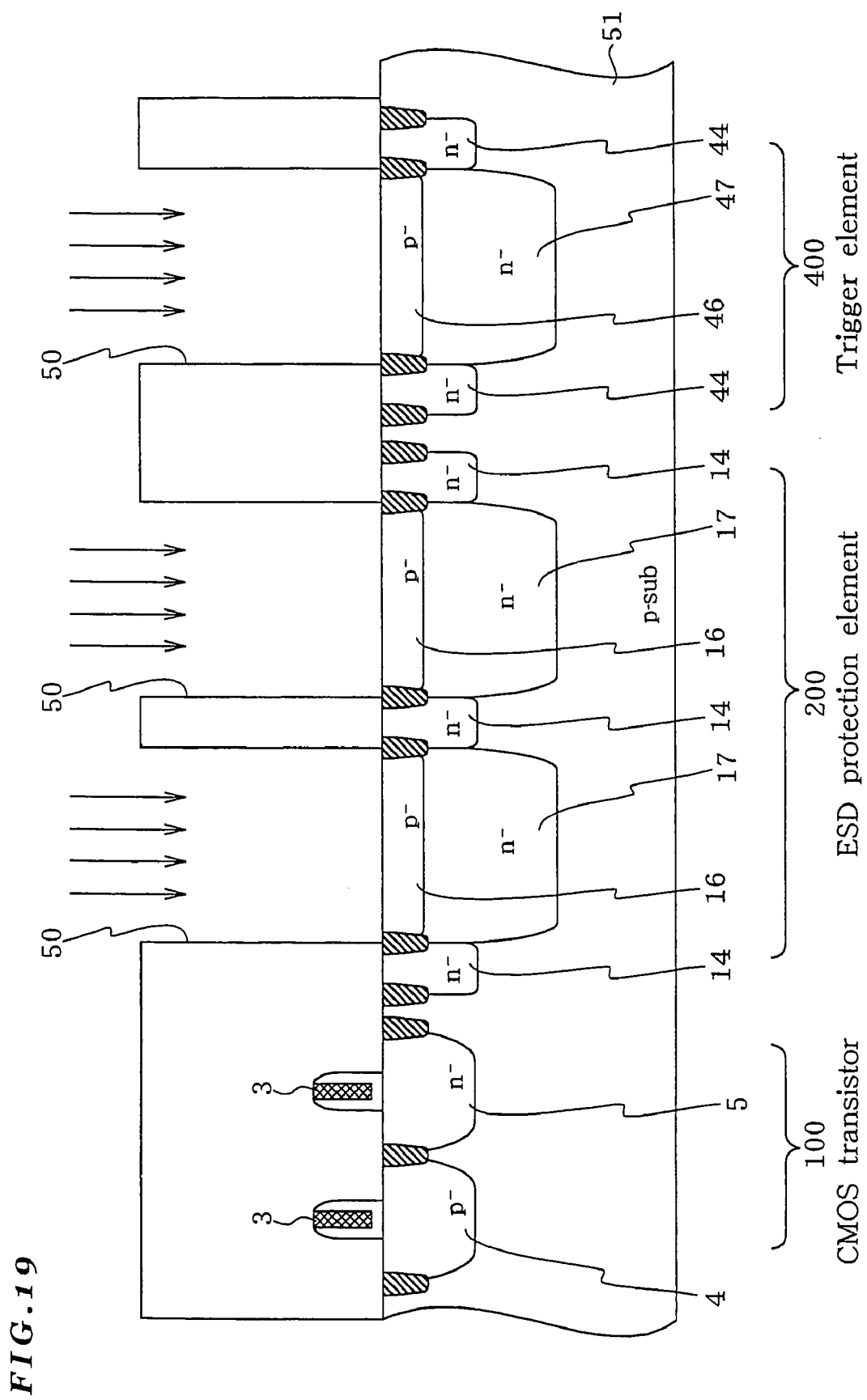
FIG. 19 is a cross-section figure showing the method for fabricating the ESD protection apparatus of FIG. 16.
Figure 20:
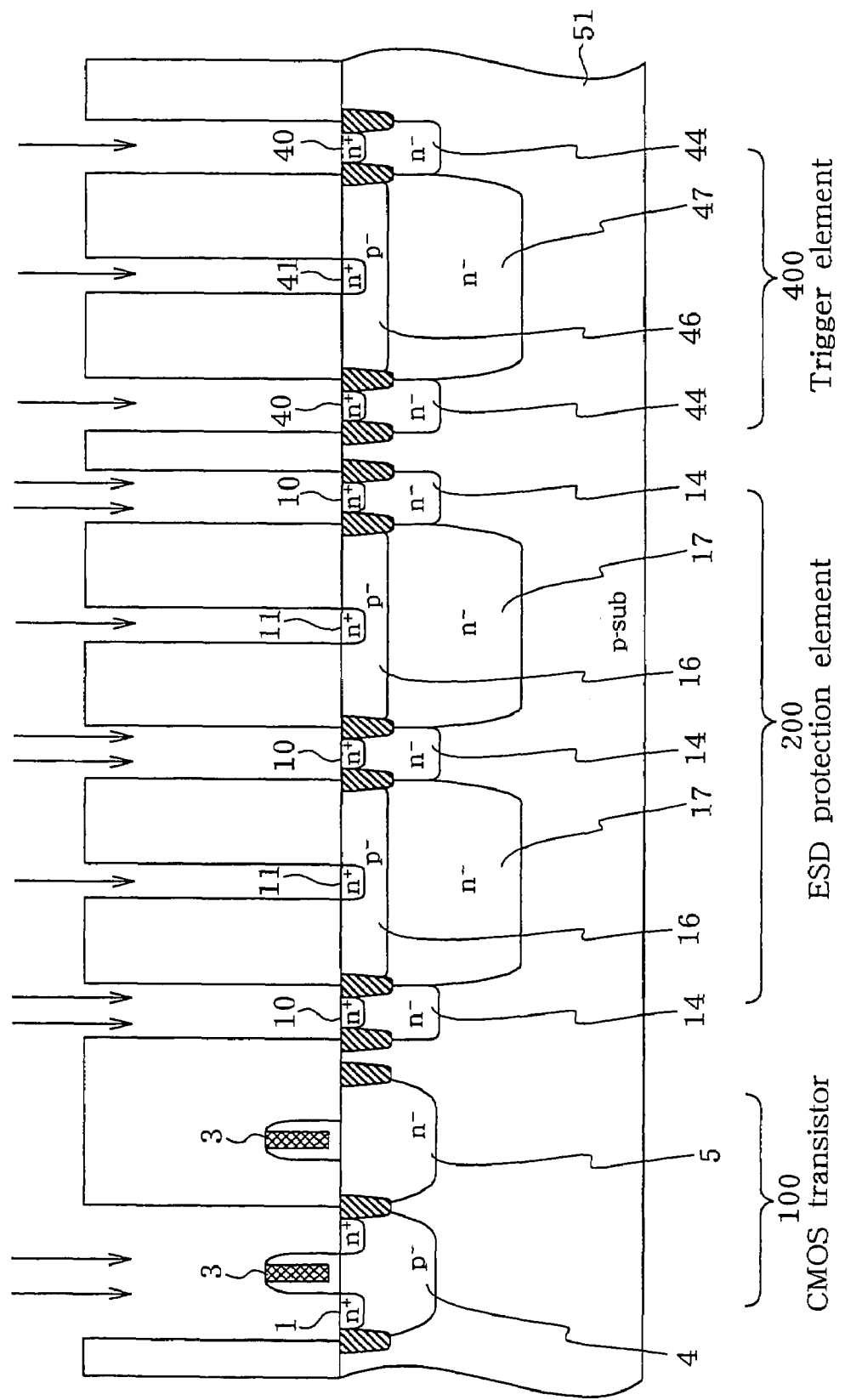
FIG. 20 is a cross-section figure showing the method for fabricating the ESD protection apparatus of FIG. 16.

FIG. 19 and FIG. 20 are cross-section figures illustrating the method for fabricating the ESD protection apparatus of this embodiment. Hereinafter, detailed description of the method for fabricating the ESD protection apparatus of this embodiment will be given with reference to FIG. 18 to FIG. 20.

At first, simultaneously with formation of N well 5 of the CMOS transistors 100, N wells 14 for connection for the collector lead parts 10 of the ESD protection element 200 and N wells 44 for emitter connection of the trigger element 400 are formed.

Successively, as illustrated in FIG. 19, using opening parts 50 of a resist with a prescribed shape as a mask, ion implantation is carried out to form the bases 16 of the ESD protection element 200 and continuously ion implantation is, carried out to form the collector N wells 17. At that time, the P− part 46 and the emitter N well 47 of the trigger element 400 are simultaneously formed.

Successively, as illustrated in FIG. 20, simultaneously with formation of the N+ type diffusion layer 1 of the CMOS transistors, the collector lead parts 10 and emitters 11 of the ESD protection element 200, as well as the emitter lead parts 40 and collector 41 of the trigger element 400 are formed. Further, simultaneously with formation of the P+ type diffusion layer 2 of the CMOS transistors 100, the base lead parts 12 and lead parts 42 of the P− parts 46 to be base of the trigger element 400 are formed.

The insulation film 18 of the ESD protection element 200 and the insulation film 48 of the trigger element 400 are formed. That is for preventing the emitters 11 and the base lead parts 12 of the ESD protection element 200 from being connected with the silicide formed later on the diffusion layer. In the same manner, that is for preventing the N+ part 41 and the lead parts 42 of trigger element 400 from being connected with the silicide later.

Finally, wirings are formed on these upper layers to form a circuit as illustrated in FIG. 16.

Figure 21:
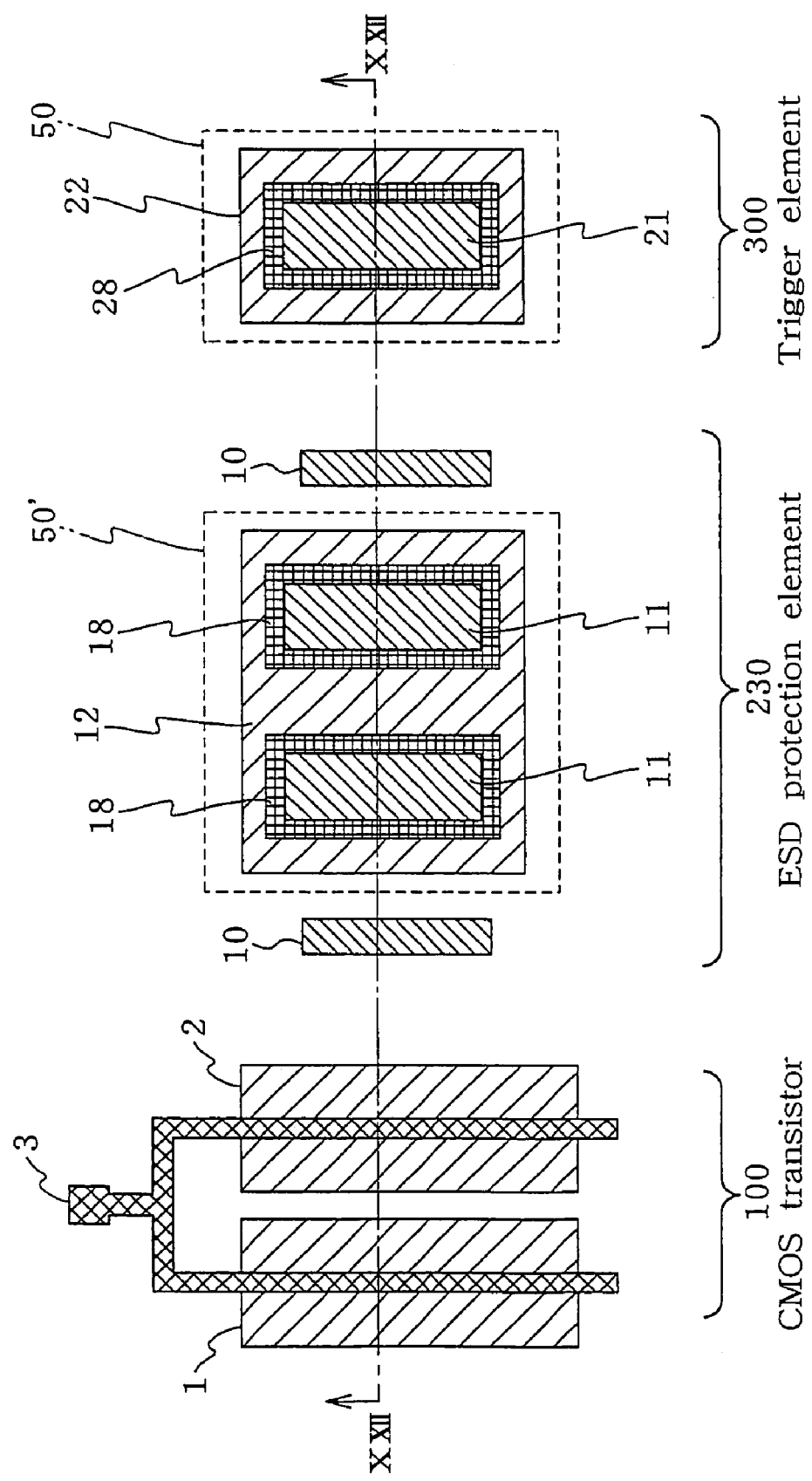
FIG. 21 is a plan view illustrating a fifth embodiment of an ESD protection apparatus of the present invention.
Figure 22:
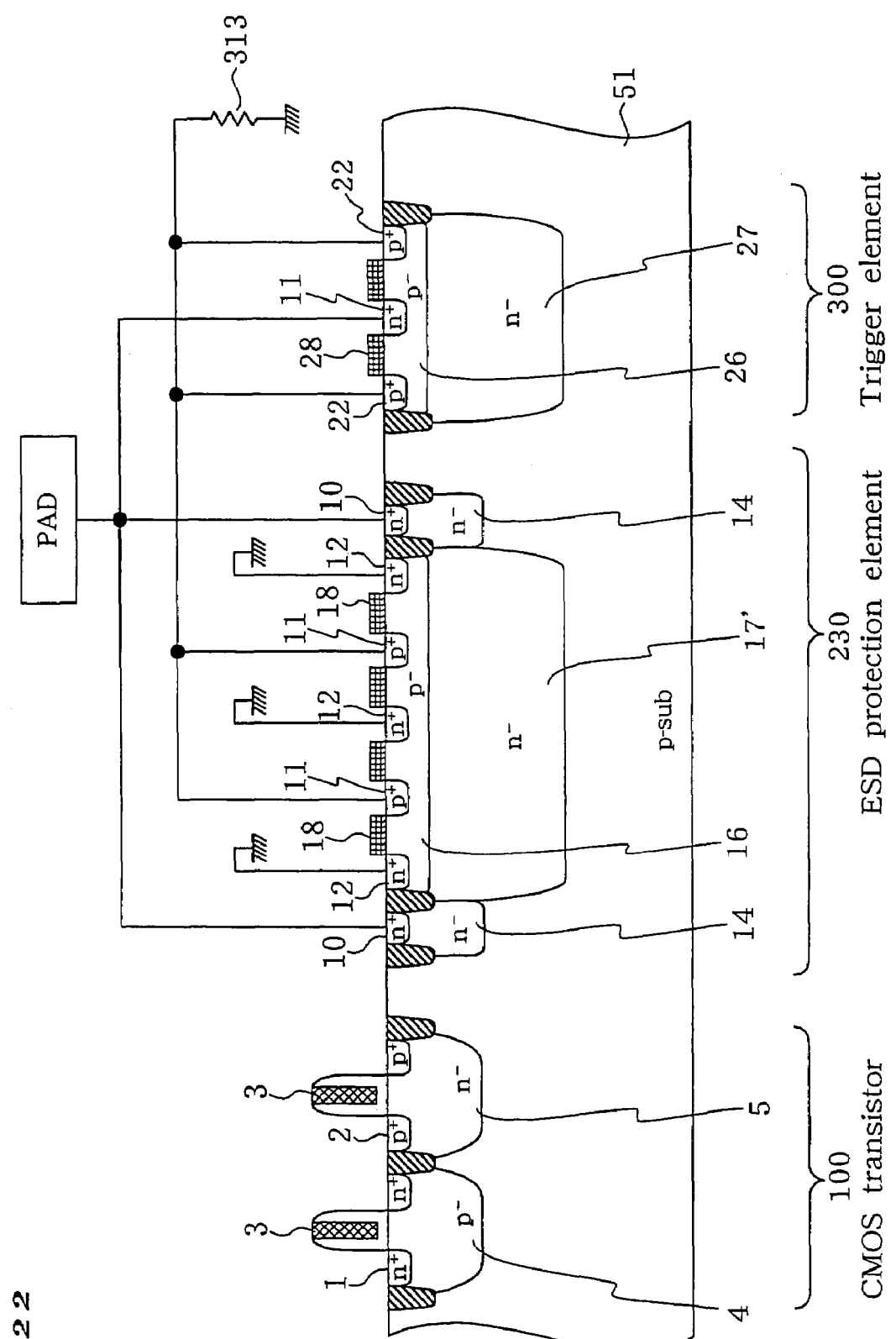
FIG. 22 is a longitudinal cross-section figure cut along the XXII-XXII line in FIG. 21.

FIG. 21 to FIG. 22 illustrate a fifth embodiment of an ESD protection apparatus relevant to the present invention. FIG. 21 shows a plan view and FIG. 22 shows the longitudinal cross-section figure cut along the XXII-XXII line in FIG. 21. Hereinafter, description will be given with reference to these figures. In the ESD protection apparatus of this embodiment, the collector of the ESD protection elements is utilized in common in order to miniaturize the surface area.

The ESD protection apparatus 230 of this embodiment comprises one collector N well 17' by making two collector N wells 17 in common in the ESD protection element 200 of the third embodiment illustrated in FIG. 10 and FIG. 11. The surface area is miniaturized by using collector lead parts 10 only in both ends of the collector N well 17'. The method for fabricating the ESD protection apparatus of this embodiment is same as that of the third embodiment illustrated in FIG. 12 to FIG. 15.

Figure 23:
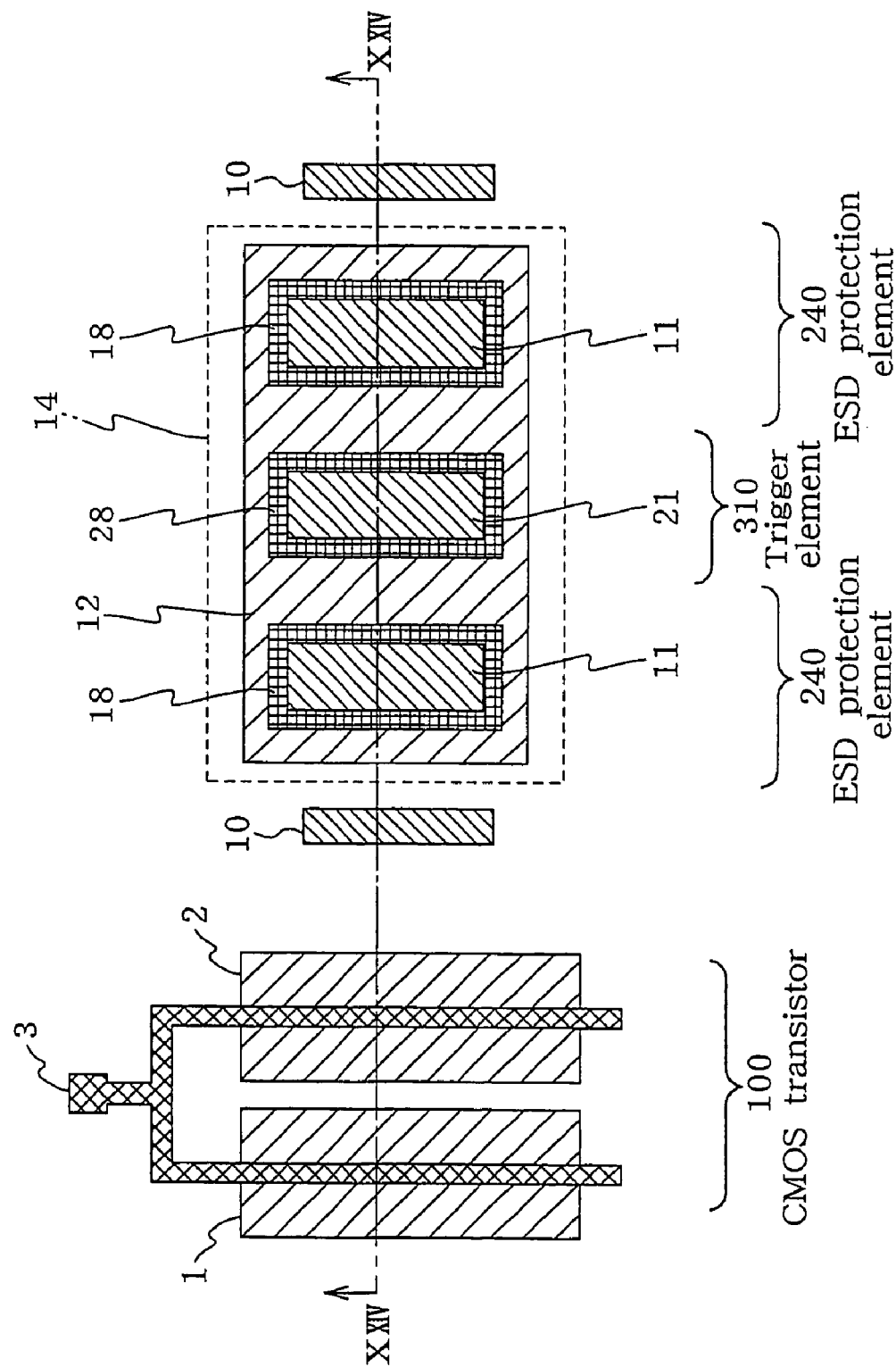
FIG. 23 is a plan view illustrating a sixth embodiment of an ESD protection apparatus of the present invention.
Figure 24:
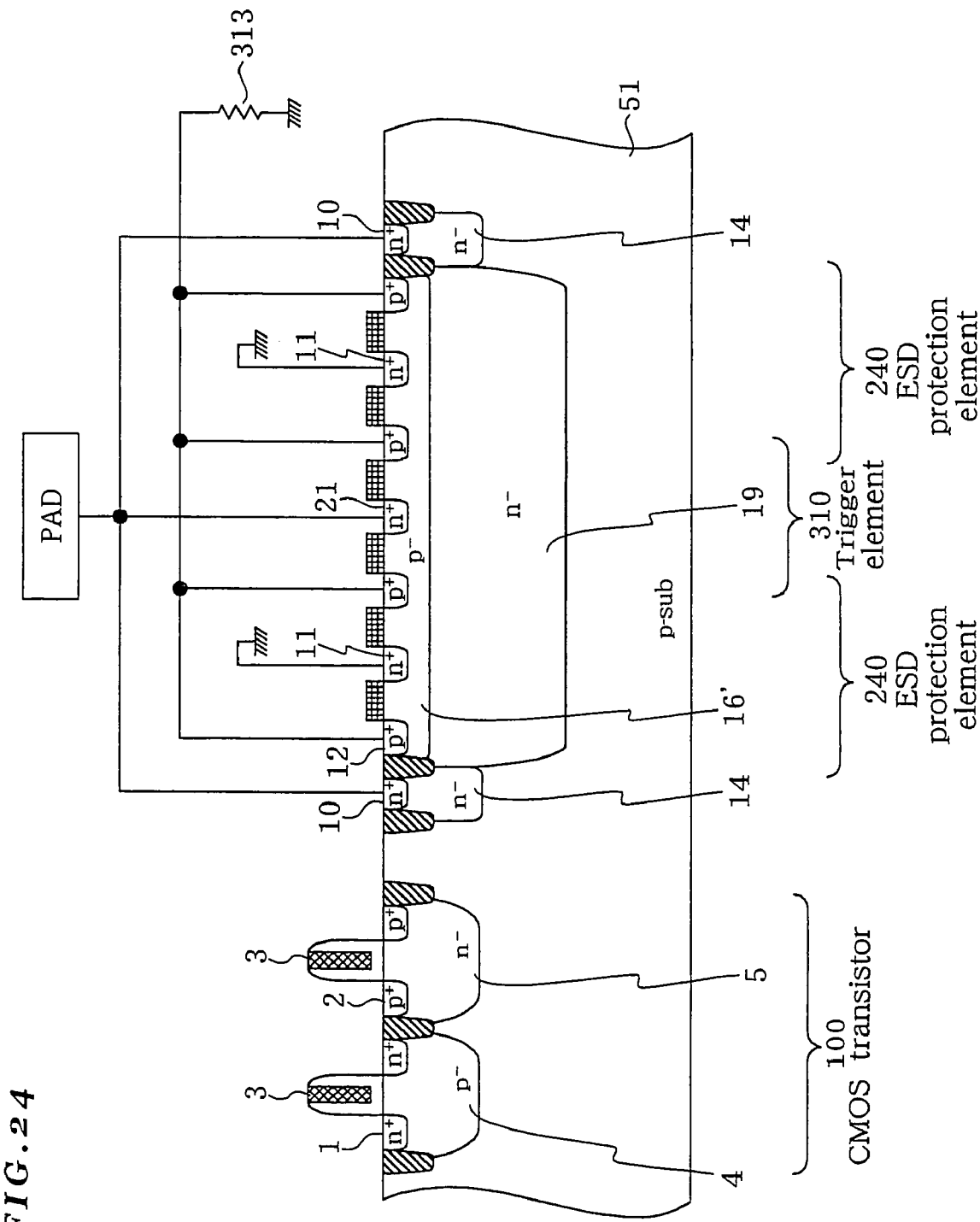
FIG. 24 is a longitudinal cross-section figure cut along the XXIV-XXIV line in FIG. 23.

FIG. 23 to FIG. 24 illustrate a sixth embodiment of an ESD protection apparatus relevant to the present invention. FIG. 23 shows a plan view and FIG. 24 shows the longitudinal cross-section figure cut along the XXIV-XXIV line in FIG. 23. Hereinafter, description will be given with reference to these figures. In the ESD protection apparatus of this embodiment, the ESD protection element and the trigger element are made in common in order to miniaturize the surface area.

The ESD protection elements 240 and the trigger element 310 of this embodiment are formed by combining two bases 16 and the P− part 26 of the ESD protection element 200 and the trigger element 300 in the third embodiment illustrated in FIG. 10 and FIG. 11 into one base 16' and at the same time combining two collector N wells 17 and the N well 27 of the ESD protection element 200 and the trigger element 300 in the third embodiment into one collector N well 19. The surface area is miniaturized by using collector lead parts 10 of the ESD protection elements 240 only in both ends. The method for fabricating the ESD protection apparatus of this embodiment is same as that of the third embodiment illustrated in FIG. 12 to FIG. 15.

Figure 25:
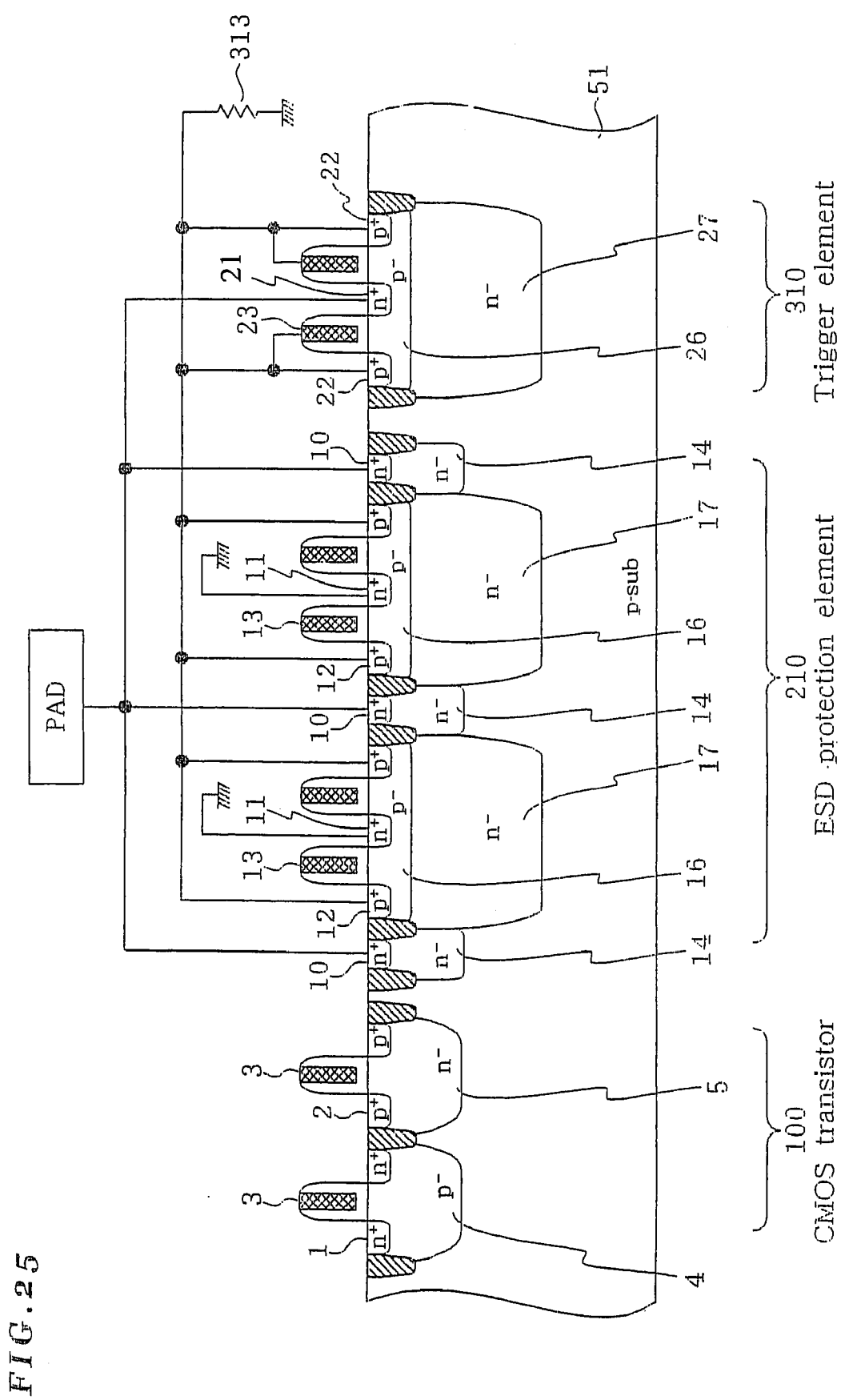
FIG. 25 is a cross-section figure illustrating a seventh embodiment of an ESD protection apparatus of the present invention.

FIG. 25 illustrates the longitudinal cross-section figure of a seventh embodiment of an ESD protection apparatus relevant to the present invention. Hereinafter, description will be given with reference to the figure. In the ESD protection apparatus of this embodiment, the ESD protection element is made to be a trigger element capable of triggering at lower voltage.

The ESD protection apparatus of this embodiment is same as the first embodiment except that the dummy gate electrode 23 of the trigger element 310 is fixed in the ground. In case of fixing the dummy gate electrodes 23 of the trigger element 310 in the ground, the electric field is intensified between the N+ part 21 and the dummy gate electrodes 23, so that triggering is caused at a lower voltage.

Figure 26:
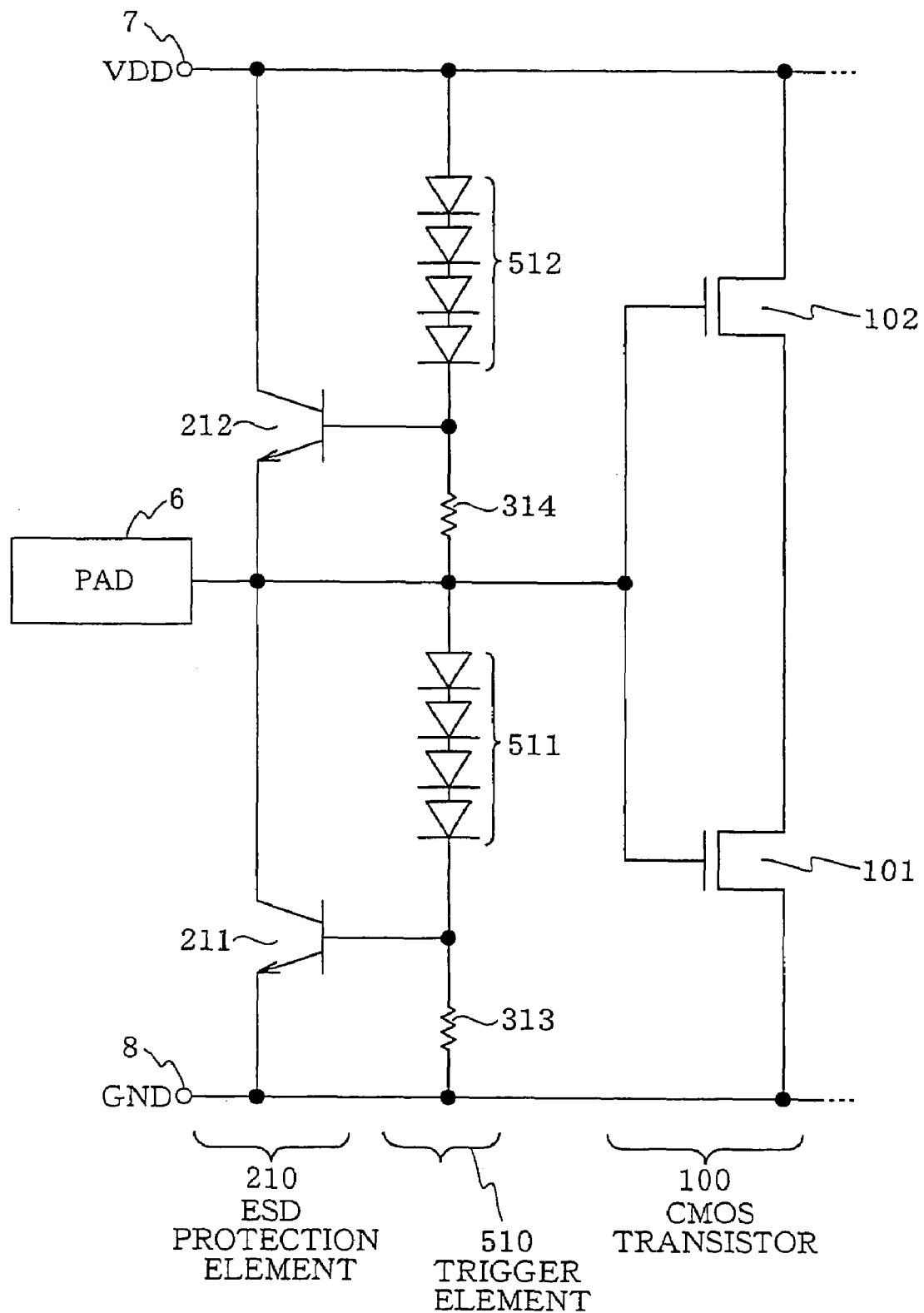
FIG. 26 is a circuit diagram showing a eighth embodiment of the ESD protection apparatus relevant to the present invention.
Figure 27:
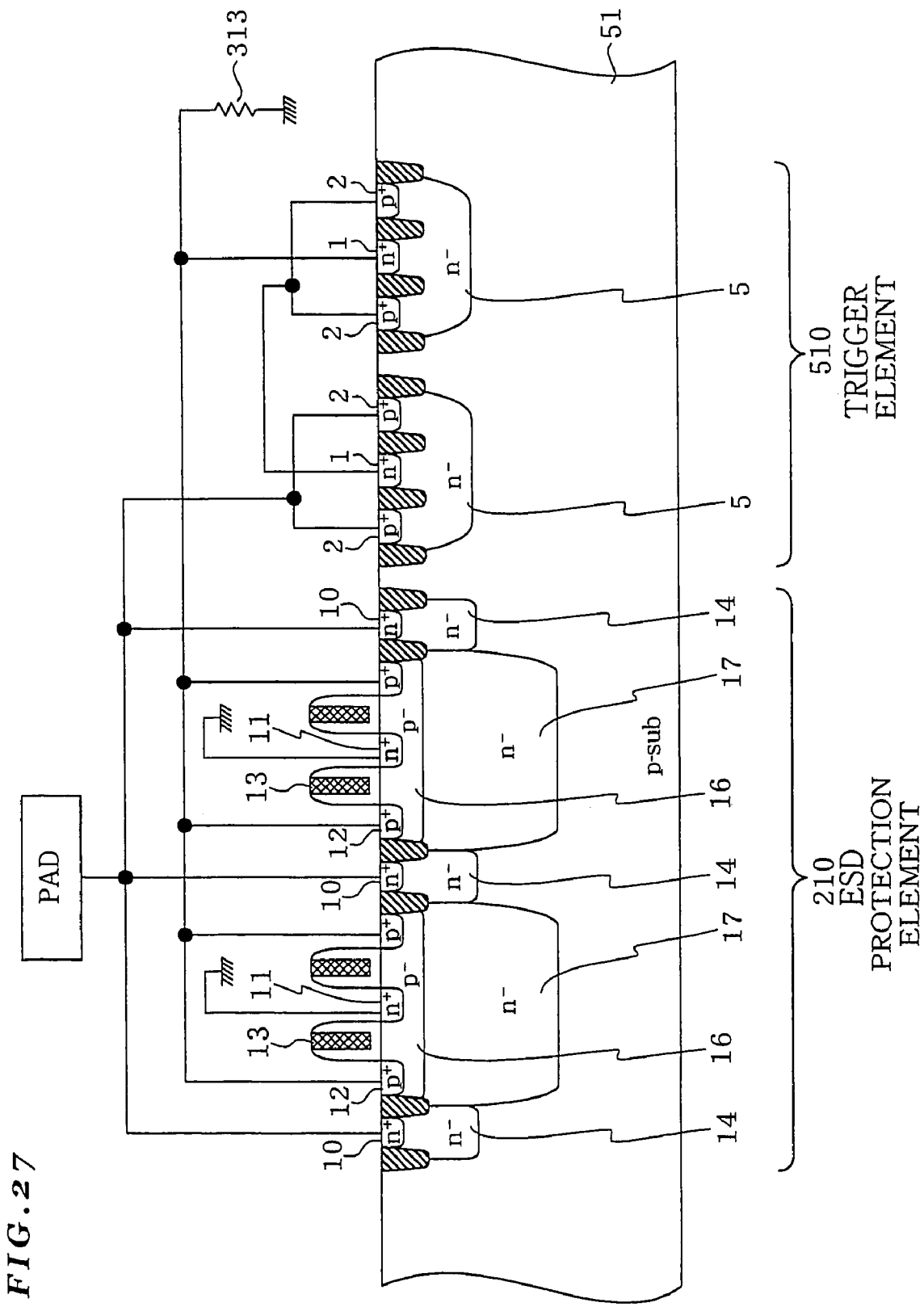
FIG. 27 is a longitudinal cross-sectional view of the ESD protection apparatus of FIG. 26.

FIG. 26 and FIG. 27 show a eighth embodiment of the ESD protection apparatus relevant to the present invention, FIG. 26 is a circuit diagram and FIG. 27 is a cross-sectional view. Hereinafter, description will be given with reference to these drawings. Parts identical with those in FIGS. 1 and 3 are given the same reference numerals as in FIGS. 1 and 3, and description thereof will be omitted. The ESD protection apparatus of the present embodiment acts as an input buffer protection circuit.

The ESD protection apparatus of the present embodiment is installed between an input terminal (an input pad) 6 of a semiconductor integrated circuit chip and a CMOS transistor 100 and comprises a trigger element 510 comprising diodes 511, 512 which are broken down by overvoltage applied to the input terminal 6 and an ESD protection element 210 comprising longitudinal bipolar transistors 211, 212 for discharging the accumulated electric charge of the input terminal 6 by being electrically discharged owing to the breakdown of the diodes 511, 512. The diodes 511, 512 are a plurality of diodes connected in series, and the overvoltage is a forward voltage for the diodes 511, 512 and the breakdown is a substantial breakdown by being electrically discharged. Incidentally, the diodes 511, 512 are illustrated in FIG. 26 as four diodes connected in series, but in FIG. 27 simplified and illustrated as two diodes connected in series for convenience's sake.

Regarding the diode 511, a cathode is connected with a base of the longitudinal bipolar transistor 211 and an anode is connected with the input terminal 6. Regarding the diode 512, the cathode is connected with the base of the longitudinal bipolar transistor 212 and the anode is connected with an electric power source terminal 7. A resistor 313 is connected between the cathode of the diode 511 and a ground terminal 8. A resistor 314 is connected between the cathode of the diode 512 and the input terminal 6.

The longitudinal bipolar transistor 211, 212 use the same transistors as those of a first embodiment. The diodes 511, 512 are formed by an N+ diffusion layer 1, a P+ diffusion layer 2 and an N well 5 and the like which are formed at the time of the usual CMOS process.

In the first embodiment, for the trigger element, the breakdown of the inverse diode was utilized. In contrast, in the present embodiment, the trigger element 510 multistage-connected for raising a forward diode equal to or more than an electric power source voltage is employed.

Especially, a low voltage operation device having equal to or less than 1.5V has an extremely thin gate insulation film and therefore is broken down by application of equal to or more than 5V. For realizing low voltage trigger capable of preventing the breakdown of the gate insulation film in this voltage range, the present embodiment is effective. In the present embodiment, by changing serial connection stages of the diode corresponding to the electric power source voltage, a desired trigger voltage can be secured.

Figure 28:
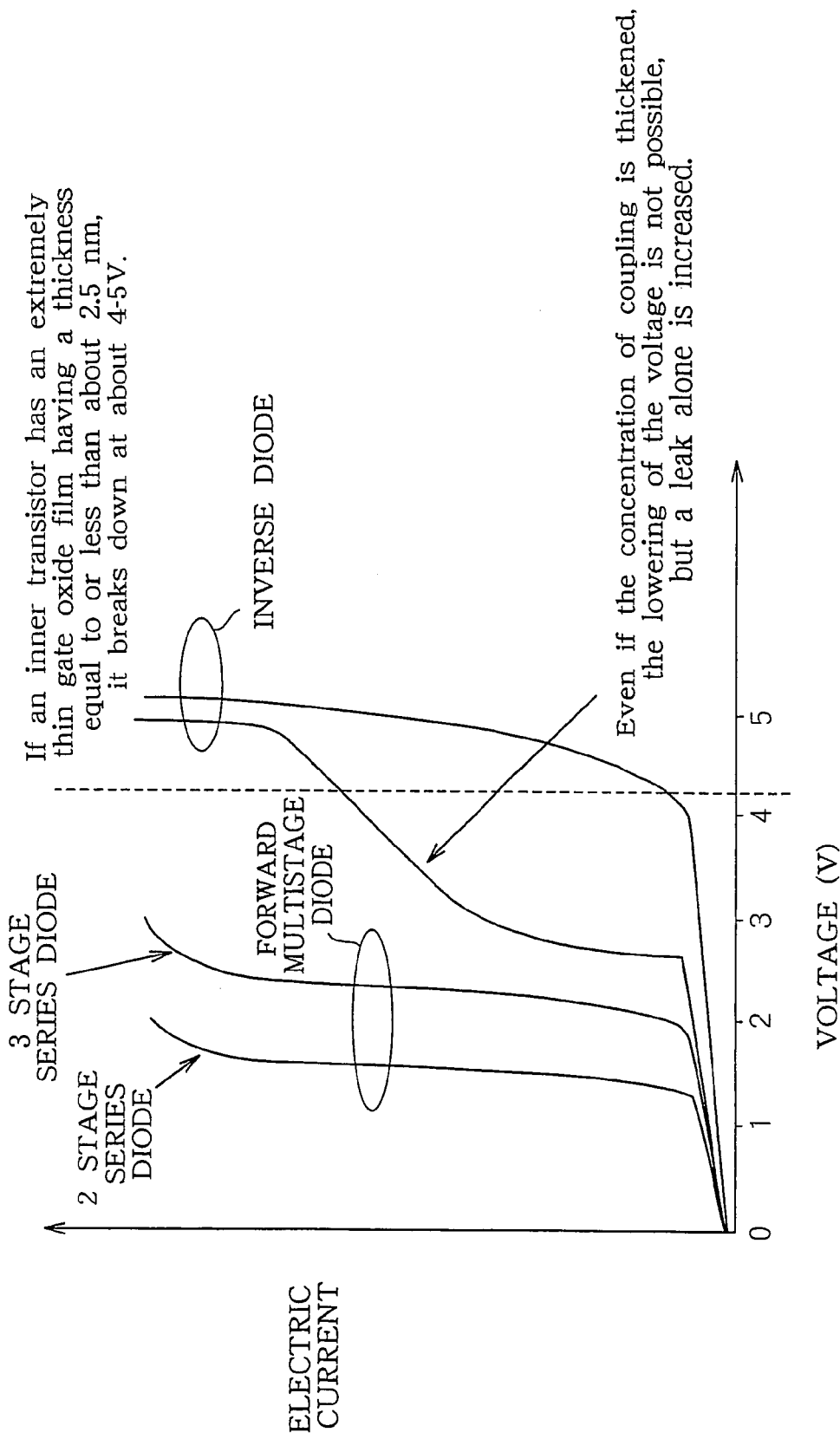
FIG. 28 is a graph showing a comparison result of characteristics of a trigger element using the breakdown of an inverse diode and the trigger element multistage-connecting the forward diodes in series.

FIG. 28 is a graph showing a comparison result of the characteristics of the trigger element utilizing the breakdown of the inverse diode and the trigger element multistage-connecting the forward diodes in series. Hereinafter, description will be given with reference to this illustration.

Regarding utilization of the inverse breakdown, when the triggering at a voltage equal to or less than 5V is to be performed, by thickening the concentration of coupling, the lowering of the voltage to a certain degree is possible. However, before the breakdown, a zener leak is increased, thereby causing a drawback which is an increase of an off leak at the usual LSI operation time. For this reason, the lowering of the breakdown voltage to equal to or more than this is difficult. Hence, by using the trigger element for multistage-connecting the forward diodes and supplying the electric current to the base of the longitudinal bipolar transistor, the ESD protection element triggering at much lower voltage can be realized.

Figure 29:
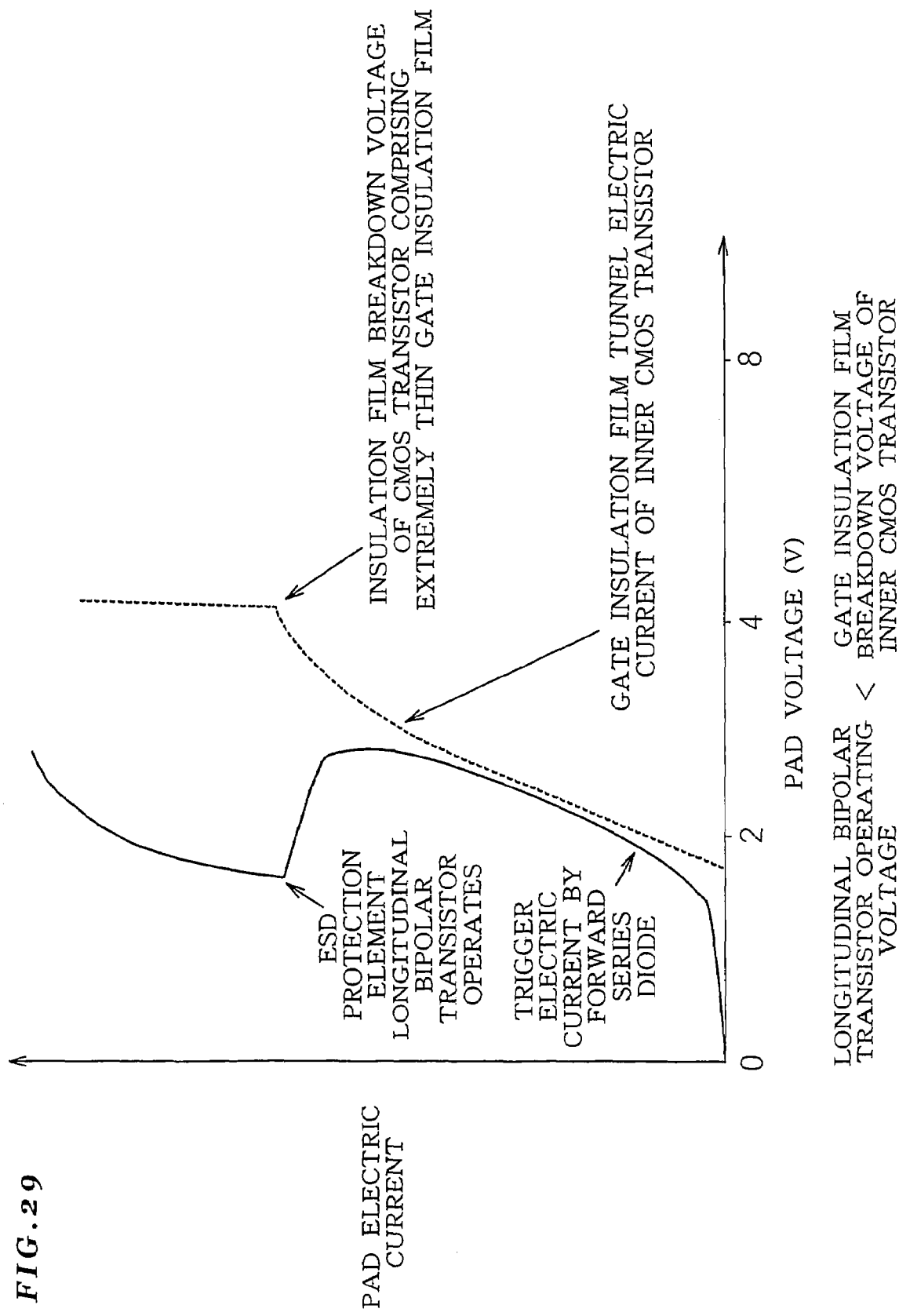
FIG. 29 is a graph showing an electric current voltage characteristic at the time when electrostatic pulses of the ESD are applied to the pad in the ESD protection apparatus of FIG. 26.

FIG. 29 is a graph showing an electric current voltage characteristic when an ESD electrostatic pulse is applied to a pad in the ESD protection apparatus of the present embodiment. Hereinafter, description will be given with reference to this illustration.

If a trigger voltage of one stage portion of the diode is taken as Vf (about 0.6V), the trigger voltage Vf of the diodes of four stages connected in series is Vf×4=about 2.4V. When a surge of the ESD is applied to the pad and exceeds 2.4V, the forward series connection diodes are electrically discharged and inject the electric current into the base of the longitudinal bipolar transistor. By this trigger electric current, the longitudinal bipolar transistor which is a protection element of a high driving force starts operation, thereby discharging a charge of the ESD.

In recent years, the CMOS device operating at a low voltage of about 1.2V uses an extremely thin gate insulation film having a thickness of about equal to or less than 2.5 nm. The breakdown withstand pressure of this gate insulation film is about 4V to 5V. In such a case, by multistage-connecting the forward diodes in series and setting the triggering voltage in such a manner as to be larger than the electric power voltage of the CMOS inner circuit, no malfunction is caused during actual operation of the LSI and the triggering of the ESD discharge can be performed below the withstand pressure of the gate insulation film.

Figure 30:
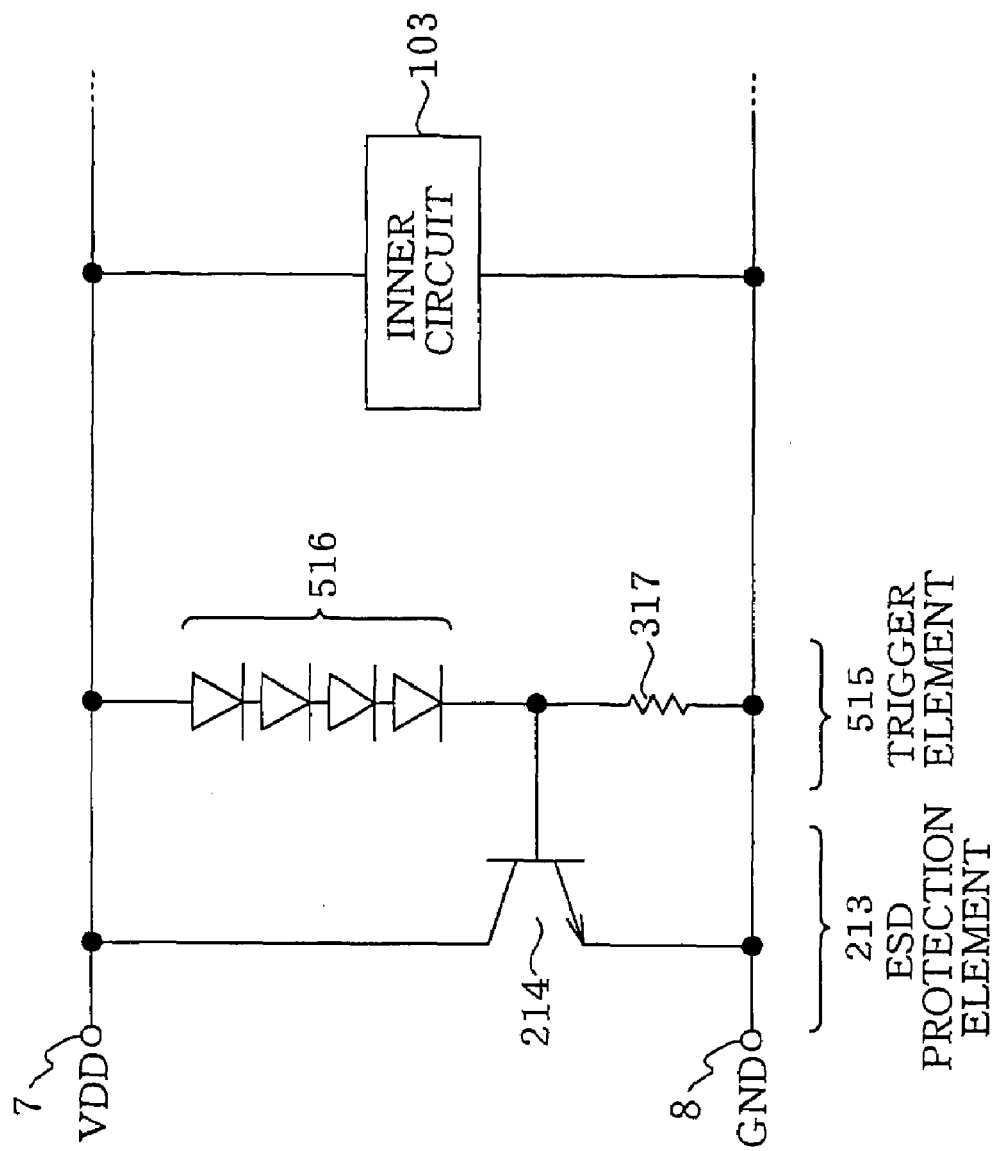
FIG. 30 is a circuit diagram showing a ninth embodiment of the ESD protection apparatus relevant to the present invention.

FIG. 30 is a circuit diagram showing a ninth embodiment of the ESD protection apparatus relevant to the present invention. Hereinafter, description will be given with reference to this illustration. The ESD protection apparatus of the present embodiment acts as an electric power source protection circuit.

The ESD protection apparatus of the present embodiment comprises a trigger element 515 comprising a diode 516 which is provided between the power source terminal 7 and the inner circuit 103 of the semiconductor integrated circuit and is broken down by overvoltage applied to an electric power source terminal 7, and an ESD protection element 213 comprising the longitudinal bipolar transistor 214 for discharging the accumulated electric charge of the electric power source terminal 7 by being electrically discharged owing to the breakdown of the diode 516. The diode 516 is a plurality of diodes connected in series, and the overvoltage is a forward voltage for the diode 516 and the breakdown is a substantial breakdown by being electrically discharged.

Regarding the diode 516, a cathode is connected with a base of the longitudinal bipolar transistor 214 and an anode is connected with the electric power source terminal 7. A resistor 317 is connected between the cathode of the diode 516 and a ground terminal 8. A longitudinal bipolar transistor 214 is of NPN type, and its collector is connected with the electric power source terminal 7, and its emitter is connected with the ground terminal 8.

A cross-sectional view thereof corresponds to FIG. 27. Consequently, the ESD protection apparatus of the present embodiment also performs the same functions and effects as the eighth embodiment.

Figure 31:
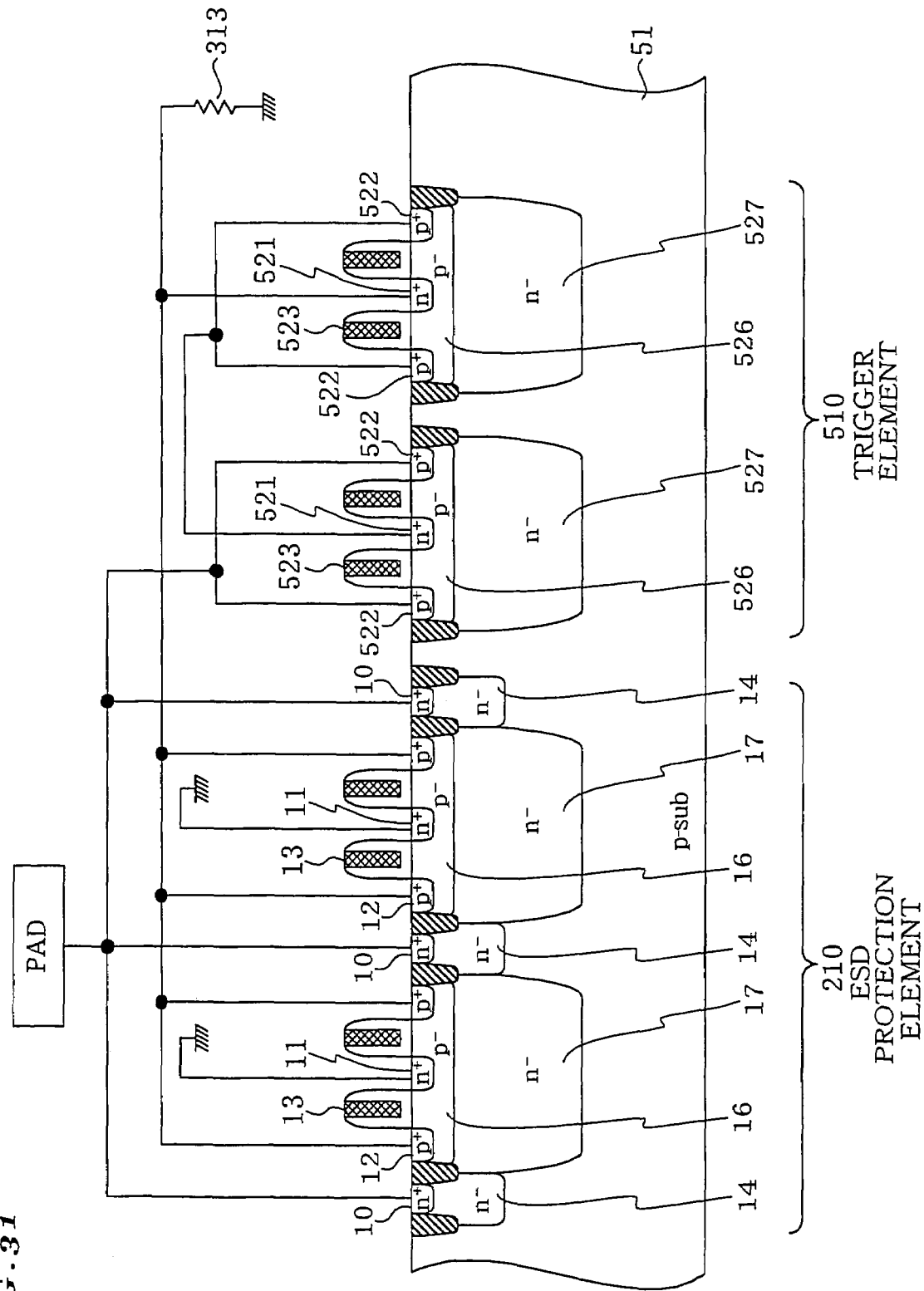
FIG. 31 is a cross-sectional view of a tenth embodiment of the ESD protection apparatus relevant to the present invention.

FIG. 31 is a cross-sectional view showing a tenth embodiment of the ESD protection apparatus relevant to the present invention. Hereinafter, description will be given with reference to the illustration. Incidentally, the circuit diagram of the ESD protection apparatus of the present embodiment is the same as the eighth embodiment (FIG. 26).

In the present embodiment, as a trigger element 510, the diodes simultaneously formed at the time when the longitudinal bipolar transistor is formed are used by connecting them in series in a forward direction. In the eighth embodiment as shown in FIG. 27, a diode comprising $P^+$ layers 2/an N well 5 is used. In contrast, in the present embodiment, a diode comprising an $N^+$ layer 521/a $P^-$ layer 526 formed at the time when the longitudinal bipolar transistor is formed is used. In a high electric current area at a time such as the ESD charge discharging time, a resistance of a well is dominant and this resistance determines a discharging capacity.

Regarding the diode comprising $P^+$ layers 2/an N well 5 as shown in FIG. 27, the electric current flows under a separation region and therefore a resistance is increased. In contrast to this, in the present embodiment, a separation between the $P^+$ layer 522/the $N^+$ layer 521 is performed by a dummy gate 523 at a formation time of the longitudinal bipolar transistor, and since adjustment of the concentration of the $P^-$ layer 526 is possible by additional injection of the longitudinal bipolar transistor, the lowering of the resistance at the high electric current area is possible.

Figure 32B:
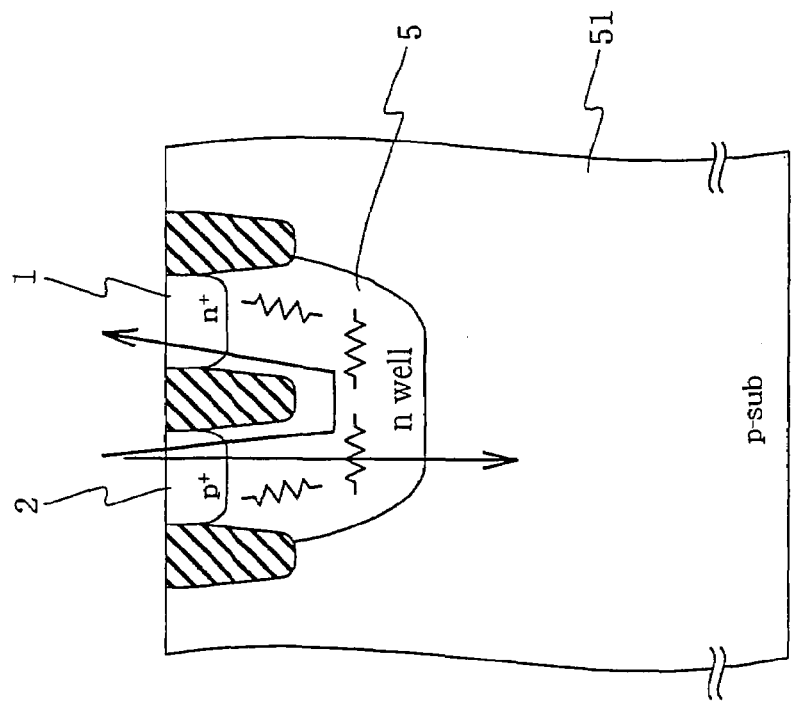
FIG. 32B is a cross-sectional view showing one portion of the longitudinal bipolar transistor in the tenth embodiment.
Figure 32A:
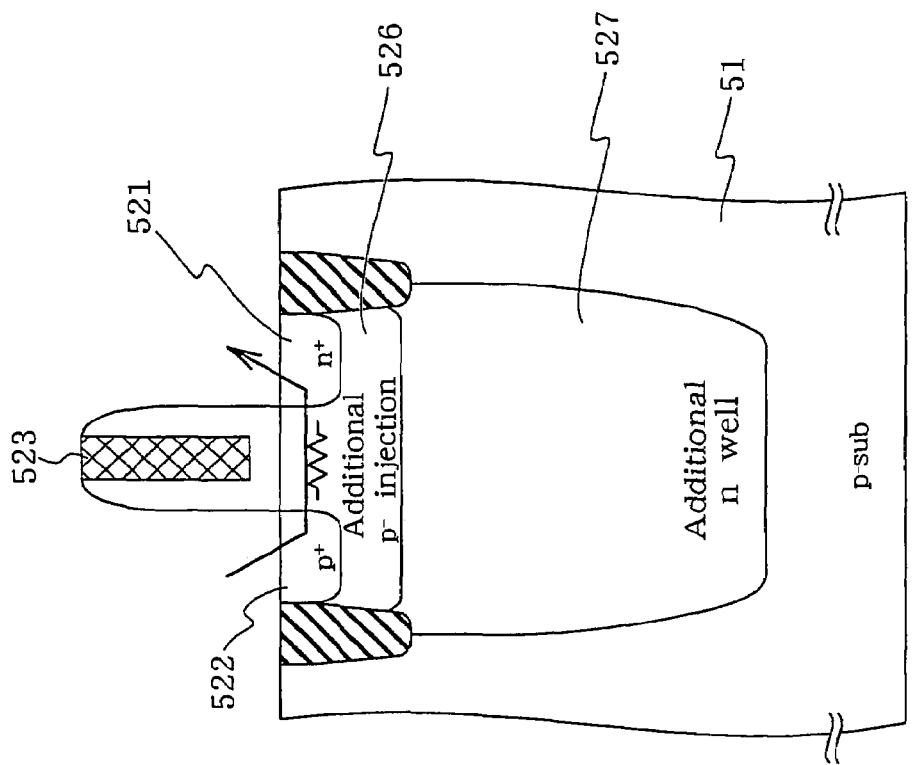
FIG. 32A is a cross-sectional view showing a diode comprising a $P^+$ layer/an N well formed in the existing CMOS process in the eighth embodiment.
Figure 33:
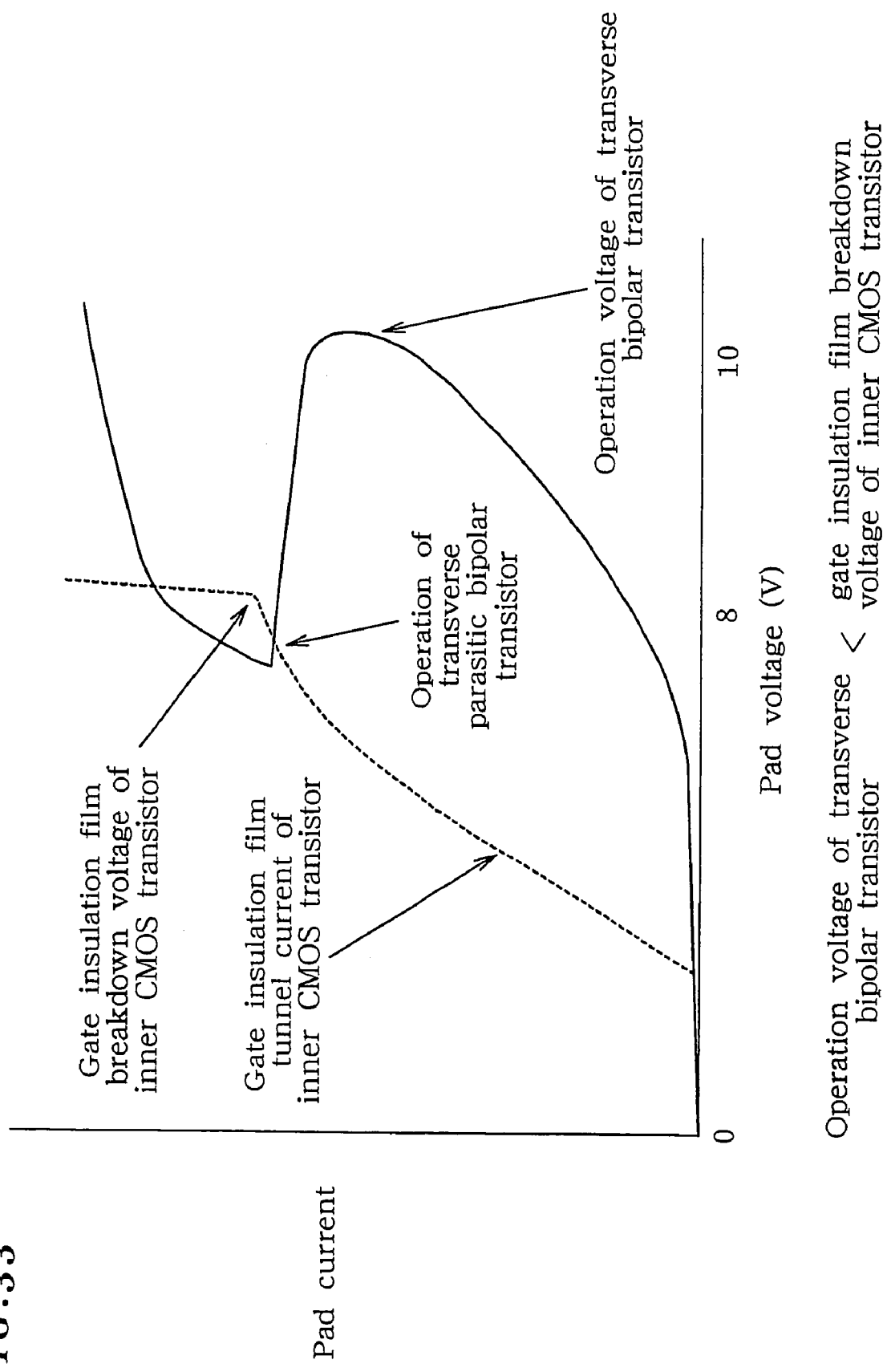
FIG. 33 is a graph showing the voltage-ampere characteristic in case of applying electrostatic pulses of ESD of a pad in a conventional technique.

In the diode comprising the $P^+$ layers 2/the N well 5 as shown in FIG. 27, since a parasitic longitudinal bipolar transistor comprising the $P^+2$ layer/the N well 5/a P substrate 51 is formed, the electric current flowing into the P substrate 51 is generated. For this reason, the electric current to be supplied to the longitudinal bipolar transistor which is a protection element is reduced. However, in the present embodiment, since an N well 527 formed simultaneously with a collector layer 17 of an ESD protection element 210 exists, the diode comprising the $N^+$ layer 521/the $P^-$ layer 526 can prevent the electric current flowing in a longitudinal direction (depth direction of substrate), and therefore the electric current can be supplied to the base of the ESD protection element 210 with high efficiency (refer to FIG. 32). Consequently, according to the present embodiment, since a trigger electric current can be supplied to a base of the longitudinal bipolar transistor with high efficiency, the size of the trigger element can be reduced.

Incidentally, the present invention is, needless to mention, not limited to the foregoing first to the tenth embodiments. For example, the P type may be taken as the N type and the N type may be taken as the P type. Consequently, the NPN type may be taken as the PNP type with each N type and P type taken as the inverse conductive type.

In an ESD protection apparatus of the present invention, since the breakdown voltage of a diode is used as a trigger of a longitudinal bipolar transistor, electric current concentration and electric field concentration are hardly caused in junction parts even if miniaturization is promoted and moreover the characteristic of triggering at a low voltage can be obtained. The method for fabricating an ESD protection apparatus of the present invention is make it easy to fabricate an ESD protection apparatus of the present invention by adding only one mask in a common CMOS process.

In other words, the effects of the present invention is as follows. The first effect is that since electric current is released in the longitudinal direction by employing a longitudinal bipolar transistor, electric current concentration is suppressed as compared with the case of releasing the electric current in the transverse direction by using a conventional CMOSFET type parasitic bipolar transistor and consequently the ESD protection element itself is hardly broken. The second effect is that since the electric current to be discharged for the same surface area is high, the surface area required for an ESD protection element can be miniaturized and consequently decrease of the input capacity necessary for high speed operation can be performed. The third effect is that since a longitudinal bipolar transistor and a trigger element can be formed by adding only one ion implantation mask for an ESD protection circuit in a common CMOSFET process, the fabrication method is carried out in a compatible process with the CMOSFET process. The fourth effect is that owing to the trigger element capable of working a low voltage, the breakdown of the gate insulation film in CMOSFET can be prevented. The fifth effect is that an element capable of triggering at a desired voltage can be form.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims as therefore intended to be embraced therein.

The entire disclosure of Japanese Patent Application No. 2000-141304 (Filed on May 15, 2000) including specification, claims, drawings and summary are incorporated herein by reference in its entirety.

The invention claimed is:

1. A method for fabricating a semiconductor integrated circuit comprising:
   a first step of simultaneously forming an $N^-$ type well of a CMOS transistor comprising an inner circuit and an $N^-$ type well for collector connection to be connected with a collector of a vertical bipolar transistor on a P type silicon substrate;
   a second step of simultaneously forming a collector $N^-$ type well to be a collector of said vertical bipolar transistor and an $N^-$ type well of a diode on said P type silicon substrate;
   a third step of simultaneously forming a $P^-$ type layer to be a base in the collector $N^-$ type well of said vertical bipolar transistor and a $P^-$ type layer to be an anode in the $N^-$ type well of said diode;
   a fourth step of simultaneously forming an $N^+$ type layer in a $P^-$ type well of said CMOS transistor, an $N^+$ type layer in the $N^-$ type well for collector connection of said vertical bipolar transistor, an $N^+$ type layer to be an emitter in the $P^-$ type layer of said vertical bipolar transistor, and an $N^+$ type layer to be a cathode in the $P^-$ type layer of said diode; and
   a fifth step of simultaneously forming a $P^+$ type layer on the $N^-$ type well of said CMOS transistor, a $P^+$ type layer on the $P^-$ type layer of said vertical bipolar transistor, and a $P^+$ type layer on the $P^-$ type layer of said diode.

2. A method for fabricating a semiconductor integrated circuit comprising:

a first step of simultaneously forming an N⁻ type well of a CMOS transistor constituting an inner circuit and an N⁻ type well for collector connection to be connected with a vertical bipolar transistor on a P type silicon substrate;

a second step of simultaneously forming a collector N⁻ type well to be a collector of said vertical bipolar transistor and a N⁻ type well of a diode on said P type silicon substrate;

a third step of simultaneously forming a P⁻ type layer to be a base in the collector N⁻ type well of said vertical bipolar transistor and a P⁻ type layer to be a cathode in the N⁻ type well of said diode;

a fourth step of simultaneously forming an N⁺ layer in a P⁻ type well of said CMOS transistor, a N⁺ layer in the N⁻ type well for collector connection of said vertical bipolar transistor, a N⁺ layer to be an emitter in the P⁻ type layer of said vertical bipolar transistor, and a N⁺ layer to be an anode in the P⁻ type layer of said diode; and a fifth step of simultaneously forming a P⁺ layer in the N⁻ type well of said CMOS transistor, a P⁺ layer in the P⁻ type layer of said vertical bipolar transistor and a P⁺ layer in the P⁻ type layer of said diode.

3. The method for fabricating the semiconductor integrated circuit according to claim 1, further comprising a step of forming a dummy gate electrode simultaneously with a gate electrode of said CMOS transistor in the region where the collector N⁻ type well of said vertical bipolar transistor and N⁻ type well of said diode are formed in said second step, wherein said dummy gate electrode is to prevent connection in the subsequent steps between the N⁺ type layers of said vertical bipolar transistor and said diode formed in said fourth step and the P⁺ type layers of said vertical bipolar transistor and said diode formed in the fifth step.

4. The method for fabricating the semiconductor integrated circuit according to claim 1, further comprising a step of forming an insulation layer which prevents connection in the subsequent steps between the N⁺ type layers of said vertical bipolar transistor and said diode formed in said fourth step and the P⁺ type layers of said vertical bipolar transistor and said diode formed in the fifth step.

5. The method for fabricating the semiconductor integrated circuit according to claim 1,
wherein an N replaces said conductive type P and a P replaces said conductive type N.

6. A method for fabricating a semiconductor integrated circuit having CMOS transistors and a bipolar transistor comprising:

simultaneously forming an N– type first well for PMOS transistor and an N– type second well for collector connection to be connected with a collector of a bipolar transistor on a P type semiconductor substrate;

providing a first mask layer above said semiconductor substrate, said first mask layer having a first opening;

forming a collector N– type well to be a collector of said bipolar transistor in said semiconductor substrate based on a shape of said first opening;

forming a P– type first layer to be a base of said bipolar transistor on said collector N– type well based on said shape of said first opening;

simultaneously forming an N+ type source-drain region of a NMOS transistor on said P type semiconductor substrate, an N+ type layer in said N– type second well for collector connection of said bipolar transistor, an N+ type layer to be an emitter in the P– type layer of said bipolar transistor; and simultaneously forming a P+ type source-drain region of PMOS transistor on said N– type well, and a P+ type base connecting region on said P– type layer to be a base region.

\* \* \* \* \*